United States Patent
Jo et al.

(10) Patent No.: US 11,133,490 B2
(45) Date of Patent: Sep. 28, 2021

(54) LIGHT EMITTING DISPLAY APPARATUS INCLUDING A SELECTIVE WAVELENGTH ABSORBING MEMBER

(71) Applicant: LG Display Co., Ltd., Seoul (KR)

(72) Inventors: Soyoung Jo, Paju-si (KR); Sookang Kim, Paju-si (KR); KeumKyu Min, Paju-si (KR); HeeJung Yang, Paju-si (KR); Mingeun Choi, Paju-si (KR)

(73) Assignee: LG Display Co., Ltd., Seoul (KR)

( * ) Notice: Subject to any disclaimer, the term of this patent is extended or adjusted under 35 U.S.C. 154(b) by 27 days.

(21) Appl. No.: 16/704,806

(22) Filed: Dec. 5, 2019

(65) Prior Publication Data

US 2020/0185655 A1 Jun. 11, 2020

(30) Foreign Application Priority Data

Dec. 6, 2018 (KR) .......................... 10-2018-0155980

(51) Int. Cl.
*H01L 51/52* (2006.01)

(52) U.S. Cl.
CPC ...... *H01L 51/5275* (2013.01); *H01L 51/5284* (2013.01)

(58) Field of Classification Search
CPC combination set(s) only.
See application file for complete search history.

(56) References Cited

U.S. PATENT DOCUMENTS

| | | | |
|---|---|---|---|
| 2015/0129852 A1* | 5/2015 | Park | H01L 27/3213 257/40 |
| 2015/0380466 A1* | 12/2015 | Koo | H01L 51/5275 257/40 |
| 2017/0025482 A1* | 1/2017 | Choi | H01L 27/322 |
| 2018/0122874 A1 | 5/2018 | Kim et al. | |
| 2018/0197921 A1* | 7/2018 | Kim | G06F 3/0412 |

FOREIGN PATENT DOCUMENTS

KR 10-2018-0047331 A 5/2018

* cited by examiner

*Primary Examiner* — Nduka E Ojeh
(74) *Attorney, Agent, or Firm* — Seed IP Law Group LLP

(57) ABSTRACT

A light emitting display apparatus is disclosed, which can improve visual characteristic of a black image in accordance with reduction of diffuse reflectance while improving light emission efficiency of light emitted from a light emitting diode. The light emitting display apparatus comprises a substrate including a plurality of pixel areas, a light emission pattern arranged in each of the plurality of pixel areas, a light emitting device layer arranged over the light emission pattern, and a selective wavelength absorbing member overlapped with at least one of the plurality of pixel areas, wherein the selective wavelength absorbing member may reduce transmittance of light of a long wavelength, which is incident.

18 Claims, 9 Drawing Sheets

LIGHT EMITTING DISPLAY APPARATUS INCLUDING A SELECTIVE WAVELENGTH ABSORBING MEMBER

CROSS-REFERENCE TO RELATED APPLICATIONS

This application claims the benefit of the Korean Patent Application No. 10-2018-0155980 filed on Dec. 6, 2018, which is hereby incorporated by reference as if fully set forth herein.

BACKGROUND

Technical Field

The present disclosure relates to a light emitting display apparatus.

Description of the Related Art

A light emitting display apparatus has a high response speed, low power consumption, and is a self-light emitting display apparatus without using a particular light source unlike a liquid crystal display apparatus, the light emitting display apparatus does not cause a problem in a viewing angle and thus attracts attention as a next-generation flat panel display device.

A light emitting display apparatus displays an image by emission of light from light emitting elements including a light emitting layer interposed between two electrodes. In this case, light generated by emission of light from the light emitting elements is externally discharged through the electrodes, a substrate, and the like.

However, in such a light emitting display apparatus, some of the emitted light from the light emitting elements is not externally discharged due to various internal reflections, total reflection or the like at various interface between the light emitting layer and an electrode and/or an interface between the substrate and an air layer, whereby light emission efficiency is reduced. For example, in some current light emitting display apparatus, about 80% of the light emitted from the light emitting elements remains inside the display device, without being emitted to the outside, and about 20% of light may be emitted to the outside.

Therefore, the current general light emitting display apparatus has problems in that luminance is lower than the light generated and power consumption is increased to provide a certain output from the display device due to low light emission efficiency.

BRIEF SUMMARY

An object of the present disclosure is to provide a light emitting display apparatus that can improve light emission efficiency of light emitted from a light emitting diode.

Another object of the present disclosure is to provide a light emitting display apparatus that can improve visual characteristic of a black image in accordance with reduction of diffuse reflectance while improving light emission efficiency of light emitted from a light emitting diode.

In addition to the objects of the present disclosure as mentioned above, additional objects and features of the present disclosure will be clearly understood by those skilled in the art from the following description of the present disclosure.

In accordance with an aspect of the present disclosure, the above and other objects can be accomplished by the provision of a light emitting display apparatus comprising a substrate including a plurality of pixel areas, a light emission pattern arranged in each of the plurality of pixel areas, a light emitting device layer arranged over the light emission pattern, and a reflective reduction member overlapped with at least one of the plurality of pixel areas, wherein the reflective reduction member will reduce transmittance of light of a long wavelength, which is incident on the reflective reduction member.

In accordance with an aspect of the present disclosure, the above and other objects can be accomplished by the provision of a light emitting display apparatus comprising a substrate including a plurality of pixel areas, a light emission pattern arranged in each of the plurality of pixel areas, a light emitting device layer arranged over the light emission pattern, and a selective wavelength absorbing member overlapped with at least one of the plurality of pixel areas. In this embodiment, the reflectance reduction member is in the form of a selective wavelength absorbing member. The selective wavelength absorbing member will permit the output of light of a long wavelength that is incident on the selective wavelength absorbing member.

In accordance with another aspect of the present disclosure, the above and other objects can be accomplished by the provision of a light emitting display apparatus comprising a substrate including a plurality of pixel areas defined over a first surface, a light emission pattern arranged in each of the plurality of pixel areas, a light emitting device layer arranged over the light emission pattern, and a selective wavelength absorbing member arranged over a second surface opposite to the first surface of the substrate, wherein the selective wavelength absorbing member may reduce diffuse reflectance for light of a long wavelength, which is incident on the selective wavelength absorbing member. It may also reduce all light of a selective wavelength that passes through it in some embodiments, including diffuse reflectance light, reflected light or direct light.

According to the light emitting display apparatus of the present disclosure, light emission efficiency of light emitted from a light emitting diode may be improved, and visual characteristic of a black image may be improved in accordance with reduction of diffuse reflectance.

In some embodiments, a light emitting display apparatus is provided that comprises a substrate including a pixel area. There is a light emitting device layer positioned in the pixel area. There is at least one wavelength color filter positioned in the pixel area. A selective wavelength absorbing member is positioned aligned with the at least one color filter selective wavelength absorbing overlying the pixel area. The selective wavelength absorbing member reduces the output of light of a long wavelength that passes through the selective wavelength absorbing member.

In one embodiment, the light emitting display apparatus further included a light emission pattern positioned in the pixel area. In other embodiments, the selective wavelength absorbing member is within the at least one color filter. In one embodiment, the selective wavelength absorbing member is positioned below the at least one color filter. In some embodiments, the selective wavelength absorbing member is positioned over the at least one color filter.

According to one embodiment, a light emitting display apparatus is provided that comprises a substrate including a pixel area. There is a micro lens positioned in the pixel area. There is a light emitting device layer positioned over the micro lens. A selective wavelength absorbing member is positioned to overlay the pixel area. The selective wavelength absorbing member reduces transmittance of light of a long wavelength, which is incident on the selective wavelength absorbing member.

In most embodiments, the light emitting display apparatus includes a blue subpixel and a green subpixel within the pixel. It might also include a white pixel in some designs. In some cases, the light emitting display apparatus is positioned to overlay the entire pixel, including all subpixels within the pixel, while in other designs, it will overlay only the blue, red and green and not the white subpixel. Yet, in other designs, the selective wavelength absorbing member positioned to overlay only the red subpixel within the pixel.

In some cases, the light emitting display apparatus includes a substrate having a pixel area with a plurality of subpixels including a red subpixel, a blue subpixel and a green subpixel. A light emitting device layer is positioned in each of the sub-pixels. A selective wavelength absorbing member is positioned overlying at least a portion of the pixel area. The selective wavelength absorbing member reduces the output of light of a long wavelength that is within a range that is in excess of 630 nm and less than 740 nm. In embodiments, the light emitting display includes a light emission pattern positioned within the pixel area through which light emission patter outputs diffuse reflective light.

In addition to the effects of the present disclosure as mentioned above, additional advantages and features of the present disclosure will be clearly understood by those skilled in the art from the following description of the present disclosure.

BRIEF DESCRIPTION OF THE SEVERAL VIEWS OF THE DRAWINGS

The above and other objects, features and other advantages of the present disclosure will be more clearly understood from the following detailed description taken in conjunction with the accompanying drawings, in which.

DETAILED DESCRIPTION

Figure 1:
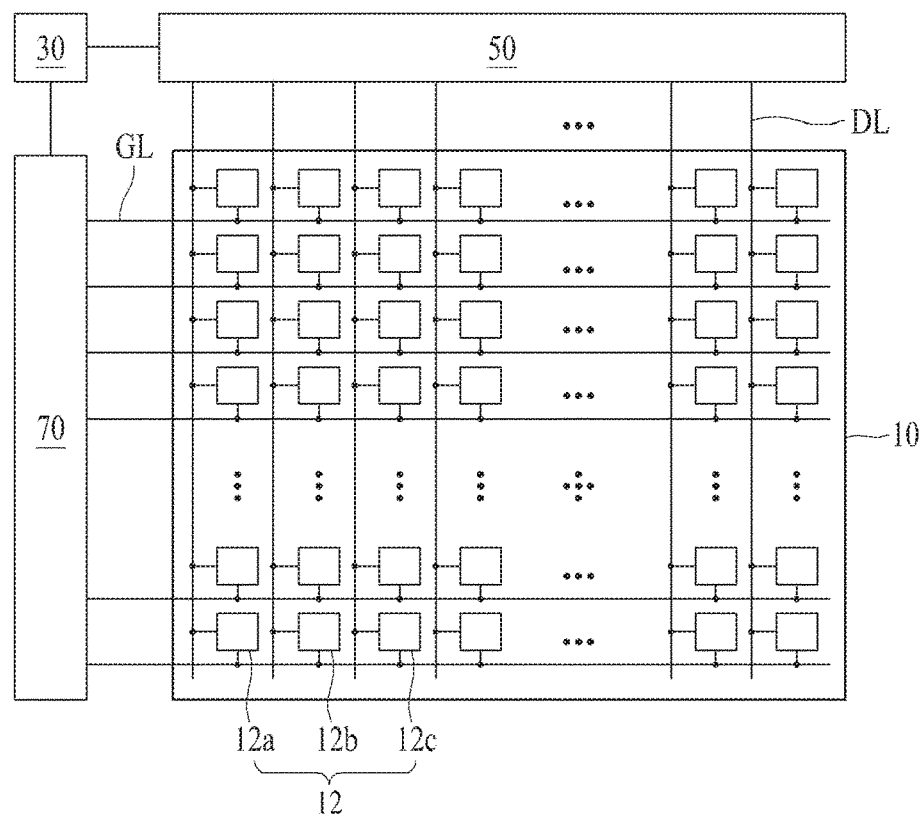
FIG. 1 is a view briefly illustrating a light emitting display apparatus according to the present disclosure.

Advantages and features of the present disclosure, and implementation methods thereof will be clarified through following embodiments described with reference to the accompanying drawings. The present disclosure may, however, be embodied in different forms and should not be construed as limited to the embodiments set forth herein. Rather, these embodiments are provided so that this disclosure will be thorough and complete, and will fully convey the scope of the present disclosure to those skilled in the art. Further, the present disclosure is only defined by scopes of claims.

A shape, a size, a ratio, an angle, and a number disclosed in the drawings for describing embodiments of the present disclosure are merely an example, and thus, the present disclosure is not limited to the illustrated details. Like reference numerals refer to like elements throughout the specification. In the following description, when the detailed description of the relevant known function or configuration is well known and might obscure the embodiments of the present disclosure, the detailed description of such will be omitted.

In a case where 'comprise,' 'have,' and 'include' described in the present specification are used, another part may be added unless 'only~' is used. The terms of a singular form may include plural forms unless referred to the contrary.

In construing an element, the element is construed as including an error range although there is no explicit description.

The term "arranged" as used herein is used in its broadest sense and includes the meaning of positioned, located, being positioned, organized and the like.

In describing a position relationship, for example, when the position relationship is described as 'upon~,' 'above~,' 'below~,' and 'next to~,' one or more portions may be arranged between two other portions unless 'just' or 'direct' is used.

In describing a time relationship, for example, when the temporal order is described as 'after~,' 'subsequent~,' 'next~,' and 'before~,' a case which is not continuous may be included unless 'just' or 'direct' is used.

It will be understood that, although the terms "first," "second," etc., may be used herein to describe various elements, these elements should not be limited by these terms. These terms are only used to distinguish one element from another. For example, a first element could be termed a second element, and, similarly, a second element could be termed a first element, without departing from the scope of the present disclosure.

The term "at least one" should be understood as including any and all combinations of one or more of the associated listed items. For example, the meaning of "at least one of a first item, a second item, and a third item" denotes the combination of all items proposed from two or more of the first item, the second item, and the third item as well as the first item, the second item, or the third item.

Features of various embodiments of the present disclosure may be partially or overall coupled to or combined with each other, and may be variously inter-operated with each other and driven technically as those skilled in the art can sufficiently understand. The embodiments of the present disclosure may be carried out independently from each other, or may be carried out together in co-dependent relationship.

Hereinafter, an example of a light emitting display apparatus according to the present disclosure will be described in detail with reference to the accompanying drawings. Wherever possible, the same reference numbers will be used throughout the drawings to refer to the same or like parts.

FIG. 1 is a view briefly illustrating a light emitting display apparatus according to the present disclosure.

Referring to FIG. 1, the light emitting display apparatus according to the present disclosure may comprise a display panel 10, a control circuit 30, a data driving circuit 50, and a gate driving circuit 70.

The display panel 10 includes a plurality of gate lines GL and a plurality of data lines DL provided over a substrate, and a plurality of pixels 12a, 12b and 12c formed in a pixel area defined by the plurality of gate lines GL and the plurality of data lines DL.

Each of the plurality of pixels 12a, 12b and 12c display images in accordance with gate signals supplied from the gate lines GL adjacent thereto and data signals supplied from the data lines DL adjacent thereto. Each of the plurality of pixels 12a, 12b and 12c according to one embodiment may include a pixel circuit provided in the pixel area and a light emitting diode connected to the pixel circuit.

Each of the plurality of pixels 12a, 12b and 12c may be defined as a minimum area where light is actually emitted, and may be expressed as subpixels. In this case, three pixels adjacent to one another may constitute one unit pixel 12 for color display.

One unit pixel 12 according to one embodiment may include three pixels 12a, 12b and 12c arranged to adjoin one another along a length direction of the gate line GL. For example, one unit pixel 12 may include first to third pixels 12a, 12b and 12c. In this case, the first pixel 12a may be a red pixel, the second pixel 12b may be a green pixel, and the third pixel 12c may be a blue pixel. Light emitting diodes of the first to third pixels 12a, 12b and 12c according to one embodiment may emit their respective colored lights. It may also include a white pixel. There are a plurality of pixel units in the display and a plurality of pixel areas in each pixel unit.

One unit pixel 12 according to another embodiment may include three pixels 12a, 12b and 12c arranged to adjoin one another along a length direction of the data line DL. In case of the unit pixel 12, the number of gate lines GL connected to the gate driving circuit 70 having a relatively simple circuit configuration is increased but the number of data lines DL connected to a relatively complicated data driving circuit 50 is reduced.

The control circuit 30 may generate pixel data for each pixel corresponding to each of the plurality of pixels 12a, 12b and 12c based on externally input image data. The control circuit 30 may generate a data control signal based on a timing synchronization signal and provide the generated data control signal to the data driving circuit 50. The control circuit 30 may generate a gate control signal based on a timing synchronization signal and provide the generated gate control signal to the gate driving circuit 70.

The data driving circuit 50 may be connected with the plurality of data lines DL provided over the display panel 10. The data driving circuit 50 may receive the pixel data for each pixel and the data control signal provided from the control circuit 30 and receive a plurality of reference gamma voltages provided from a power circuit. The data driving circuit 50 may converts the pixel data for each pixel to a pixel data for each pixel signal (or voltage) by using the data control signal and the plurality of reference gamma voltages and supply the converted pixel data for each pixel signal to the corresponding data line DL.

The gate driving circuit 70 may be connected with the plurality of gate lines GL provided in the display panel 10. The gate driving circuit 70 may generate gate signals in accordance with a preset order based on the gate control signal supplied from the control circuit 30, and supply the gate signals to the corresponding gate lines GL.

The gate driving circuit 70 according to one embodiment of the present disclosure may be integrated with one edge or both edges of the display panel 10 in accordance with a manufacturing process of the thin film transistor, and may be connected with the plurality of gate lines GL by a one-to-one correspondence. The gate driving circuit 70 according to one embodiment of the present disclosure may be formed in an integrated circuit, may be provided at the substrate or a flexible circuit film, and may be connected with the plurality of gate lines GL by a one-to-one correspondence.

Figure 2:
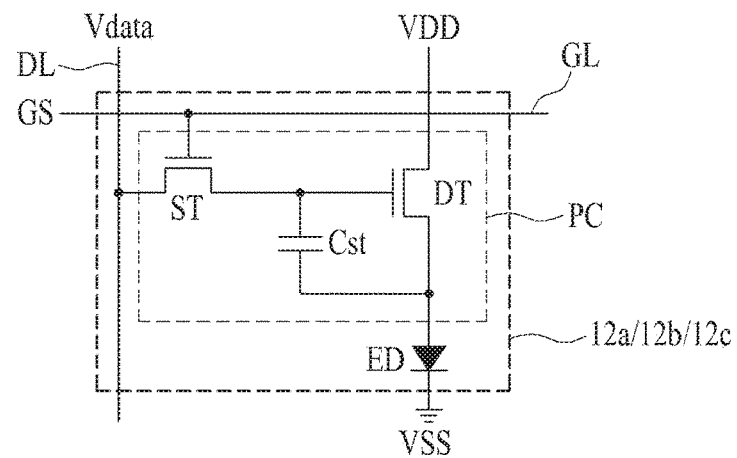
FIG. 2 is an equivalent circuit view illustrating a first pixel shown in FIG. 1.

FIG. 2 is an equivalent circuit view illustrating a first pixel shown in FIG. 1.

Referring to FIG. 2, the first pixel 12a of the light emitting display apparatus according to one embodiment includes a pixel circuit PC and a light emitting element ED (or a light emitting device).

The pixel circuit PC may be provided in a circuit portion in the pixel area defined by the gate lines GL and the data lines DL, and may be connected to its adjacent gate and data lines GL and DL and a first driving power source VDD. The pixel circuit PC may control light emission of the light emitting element ED in accordance with a data signal Vdata from the data line DL in response to a gate on signal GS from the gate line GL. The pixel circuit PC according to one embodiment may include a switching thin film transistor ST, a driving thin film transistor DT, and a capacitor Cst.

The switching thin film transistor ST may include a gate electrode connected to the gate line GL, first source/drain electrodes connected to the data line DL, and second source/drain electrodes connected to a gate electrode of the driving thin film transistor DT. The switching thin film transistor ST may be turned on in accordance with a gate on signal GS supplied from the gate line GL to supply the data signal Vdata supplied from the data line DL to the gate electrode of the driving thin film transistor DT.

The driving thin film transistor DT may include a gate electrode connected to the second source/drain electrodes of the switching thin film transistor ST, a drain electrode connected to the first driving power source VDD, and a source electrode connected to the light emitting element ED. The driving thin film transistor DT may be turned on in accordance with a gate-source voltage based on the data signal Vdata supplied from the switching thin film transistor ST, whereby the driving thin film transistor DT may control a current (or data current) supplied from the first driving power source VDD to the light emitting element ED.

The capacitor Cst may be formed between (or in an overlap area between) the gate electrode and the source electrode of the driving thin film transistor DT, store a voltage corresponding to the data signal Vdata supplied to the gate electrode of the driving thin film transistor DT, and turn on the driving thin film transistor DT by the stored voltage. In this case, the voltage stored in the capacitor Cst may be maintained until a new data signal Vdata is supplied through the switching thin film transistor ST in next frame.

The light emitting element ED may be provided in an opening portion defined in the pixel area and may emit light in accordance with a current supplied from the pixel circuit PC.

The light emitting element ED according to one embodiment may be interposed between a first electrode (or anode electrode) connected to the pixel circuit PC and a second electrode (or cathode electrode) connected to a second driving power source VSS. For example, the light emitting element ED may be an organic light emitting diode, a quantum-dot light emitting diode, or an inorganic light emitting diode, or may include a micro-light emitting diode.

The first pixel 12a of the light emitting display apparatus according to one embodiment of the present disclosure displays a predetermined image through light emission of the light emitting element ED according to a current corresponding to the data signal Vdata. Likewise, since the second and third pixels 12b and 12c respectively have the same configuration as that of the first pixel 12a, their repeated description will be omitted.

Figure 3:
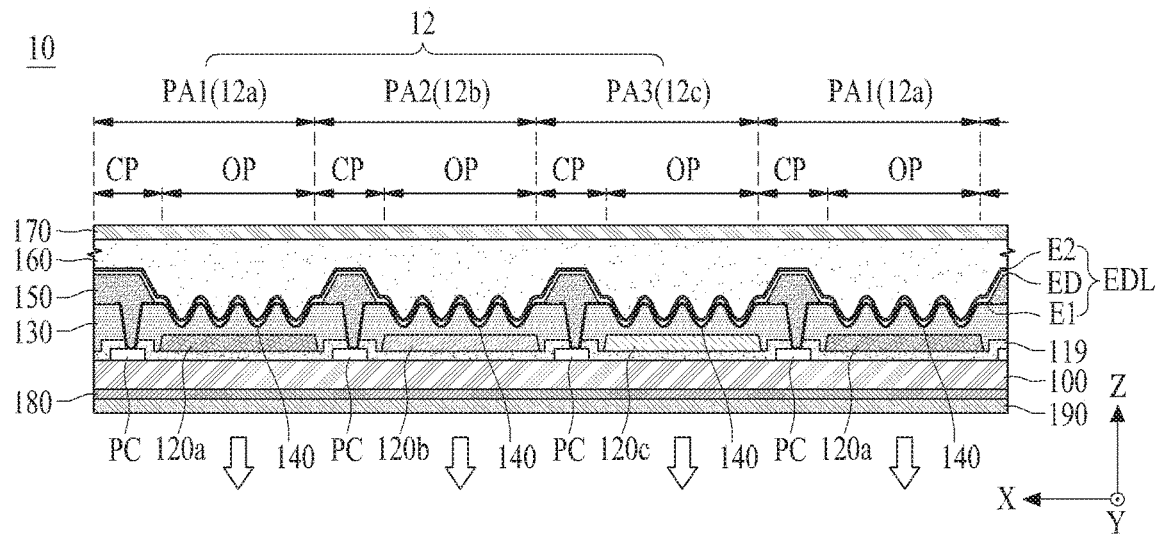
FIG. 3 is a view illustrating a display panel according to one embodiment of the present disclosure, which is shown in FIG. 1.
Figure 4A:
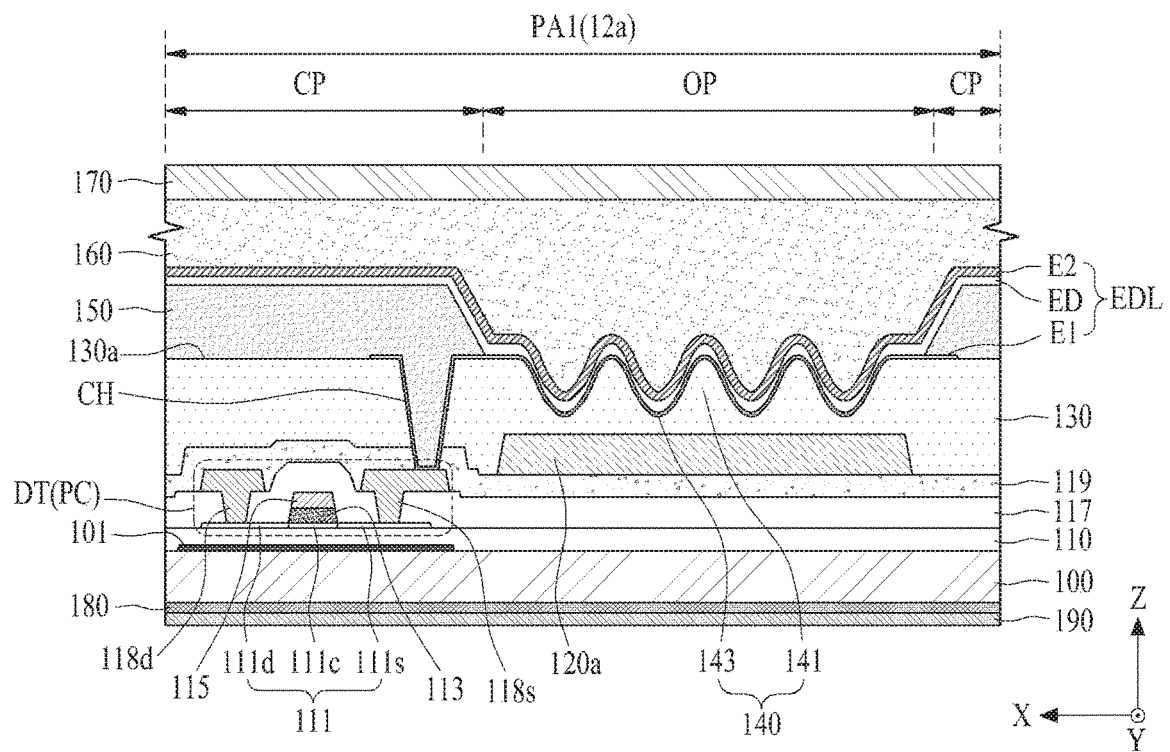
FIG. 4A is an enlarged view illustrating a first pixel shown in FIG. 3.

FIG. 3 is a view illustrating a display panel according to one embodiment of the present disclosure, which is shown in FIG. 1, and FIG. 4A is an enlarged view illustrating a first pixel shown in FIG. 3.

Referring to FIGS. 1 to 4B, the display panel 10 according to one embodiment of the present disclosure may include a substrate 100, a circuit layer, a protective layer 119, an overcoat layer 130, a light emitting device layer EDL, and a selective wavelength absorbing member 180. In some embodiments, the member 180 can be structured as a reflective reduction member 180 that absorbs diffuse reflectance light.

The substrate 100 may mainly be made of a transparent glass material, but may be made of a transparent plastic material, which may be bent or curved, for example, a polyimide material. If the substrate 100 of a plastic material is used, polyimide having heat resistance tolerable at a high temperature may be used considering that a deposition process of a high temperature is performed over the substrate 100. A front surface of the substrate 100 may fully be overlaid by one or more buffer layers 110.

The buffer layer 110 may prevent a material contained in the substrate 100 from being diffused to a transistor layer during a high-temperature process of the fabricating process of the thin film transistor. Also, the buffer layer 110 may prevent external water or moisture from being permeated into the light emitting element ED. The buffer layer 110 may be made of a silicon oxide or a silicon nitride. Optionally, the buffer layer 110 may be omitted as the case may be.

The substrate 100 according to one embodiment may include a plurality of pixel areas PA1, PA2 and PA3 having a circuit portion CP and an opening portion OP through which light is emitted.

Three adjacent pixel areas of the plurality of pixel areas PA1, PA2 and PA3 may constitute one unit pixel area. For example, one unit pixel area may include first to third pixel areas PA1, PA2 and PA3. In this case, the first pixel area PA1 may be a red pixel area, the second pixel area PA2 may be a green pixel area and the third pixel area PA3 may be a blue pixel area.

The circuit portion CP may be defined as a transistor area defined in each of the plurality of pixel areas PA1, PA2 and PA3. The opening portion OP may be defined as a light emission area through which light emitted from the light emitting device layer EDL arranged in each of the plurality of pixel areas PA1, PA2 and PA3 is emitted to the outside.

The circuit layer may include a pixel circuit PC arranged in the circuit portion CP of each of the plurality of pixel areas PA1, PA2 and PA3.

The pixel circuit PC may include a driving thin film transistor DT, a switching thin film transistor, and a capacitor.

The driving thin film transistor DT according to one embodiment may include an active layer 111, a gate insulating film 113, a gate electrode 115, an insulating interlayer 117, a drain electrode 118d, and a source electrode 118s.

The active layer 111 may include a channel area 111c, a drain area 111d and a source area 111s formed in a driving thin film transistor area of the circuit portion CP defined over the substrate 100 or the buffer layer 110. The active layer 111 may include a drain area 111d and a source area 111s which become conductors by an etching gas during an etching process of the gate insulating film 113, and a channel area 111c which does not become a conductor by the etching gas. The drain area 111d and the source area 111s may be spaced apart from each other by interposing the channel area 111c therebetween.

The active layer 111 according to one embodiment of the present disclosure may be formed of a semiconductor material such as any one among amorphous silicon, polycrystalline silicon, oxide and organic material, but is not limited to these materials. For example, the active layer 111 according to the present disclosure may be formed of an oxide material such as zinc oxide, tin oxide, Ga—In—Zn oxide, In—Zn oxide or In—Sn oxide, or may be formed of an oxide material doped with ions such as Al, Ni, Cu, Ta, Mo, Zr, V, Hf or Ti material.

The gate insulating film 113 may be formed over the channel area 111c of the active layer 111. The gate insulating film 113 may be formed over only the channel area 111c of the active layer 111 in an island shape without being formed over an entire front surface of the substrate 100 or the buffer layer 110 including the active layer 111.

The gate electrode 115 may be formed over the gate insulating film 113 to overlap the channel area 111c of the active layer 111. The gate electrode 115 serves as a mask so as to prevent the channel area 111c of the active layer 111 from being a conductor by the etching gas used for a process of patterning the gate insulating film 113 by the use of etching process. The gate electrode 15 may be formed in a single-layered structure of any one selected among molybdenum (Mo), aluminum (Al), chrome (Cr), aurum (Au), titanium (Ti), nickel (Ni), neodymium (Nd), copper (Cu), and their alloys, or may be formed in a multi-layered structure of materials selected among molybdenum (Mo), aluminum (Al), chrome (Cr), aurum (Au), titanium (Ti), nickel (Ni), neodymium (Nd), copper (Cu), and their alloys.

The insulating interlayer 117 may be formed over the gate electrode 115 and the drain area 111d and the source area 111s of the active layer 111. The insulating interlayer 117 may be formed over the entire front surface of the substrate 100 or the buffer layer 110 to overlay the gate electrode 115 and the drain area 111d and the source area 111s of the active layer 111. The insulating interlayer 117 may be made of an inorganic material such as silicon oxide (SiOx) and silicon nitride (SiNx), or may be made of an organic material such as benzocyclobutene or photo-acryl. Selectively, the insulating interlayer 117 may be expressed by the term such as a passivation layer.

The drain electrode 118d may electrically be connected with the drain area 111d of the active layer 111 through a first contact hole provided in the insulating interlayer 117 overlapped with the drain area 111d of the active layer 111.

The source electrode 118s may electrically be connected with the source area 111s of the active layer 111 through a second contact hole provided in the insulating interlayer 117 overlapped with the source area 111s of the active layer 111.

Each of the drain electrode 118d and the source electrode 118s may be made of the same metal material, for example, Mo, Al, Cr, Au, Ti, Ni, Nd, Cu, or their alloy, or may be made of a single layer or multi-layer of two layers or more of the above metals or their alloy.

The switching thin film transistor is identical in structure to the driving thin film transistor, and the switching thin film transistor is prepared over the circuit portion CP, whereby a detailed description for the switching thin film transistor will be omitted.

The capacitor may be provided in an overlap area between the gate electrode 115 and the source electrode 118s of the driving thin film transistor DT which are overlapped with each other under the circumstances that the insulating interlayer 117 is interposed in-between.

Additionally, the thin film transistor provided in the circuit portion CP may is characterized in that its threshold voltage is shifted by light. In order to prevent this phenomenon, the light emitting display apparatus according to the present disclosure may further include a light shielding layer 101 prepared under the active layer 111.

The light shielding layer 101 is provided between the substrate 100 and the active layer 111 to shield light from entering the active layer 111 through the substrate 100, whereby a threshold voltage change of the transistor by external light is minimized or avoided. The light shielding layer 101 may be overlaid by the buffer layer 110. Optionally, the light shielding layer 101 may electrically be connected with the source electrode of the transistor or a separate bias power source and therefore serve as a lower gate electrode of the corresponding transistor. In this case, the threshold voltage change of the transistor according to the bias voltage as well as characteristic change caused by light is minimized or avoided.

The protective layer 119 may be provided over the substrate 100 to overlay the circuit layer. The protective layer 119 according to one embodiment may be formed to overlay the drain electrode, the source electrode and the insulating interlayer of the thin film transistors arranged in the circuit portion CP. For example, the passivation layer 119 may be made of an inorganic material such as silicon oxide (SiOx) and silicon nitride (SiNx). Optionally, the protective layer 119 may be expressed as the term, passivation layer.

The overcoat layer 130 may be provided over the substrate 100 to overlay the protective layer 119. The overcoat layer 130 according to one embodiment may be formed to have a relative thick thickness to serve to provide a planarization surface over the substrate 100. For example, the overcoat layer 130 may be made of an organic material such as photo-acryl, benzocyclobutene, polyimide and fluorine resin. The overcoat layer 130 may be defined as a planarization layer.

The overcoat layer 130 according to one embodiment may include a light emission pattern 140 arranged in at least one pixel area. In a preferred embodiment, a light emission pattern is positioned in each of the plurality of areas PA1, PA2 and PA3.

The light emission pattern 140 may be arranged to overlap the opening portion OP of each of the plurality of pixel areas PA1, PA2 and PA3. For example, the light emission pattern 140 may be provided on the overcoat layer 130 over the opening portion OP. The light emission pattern 140 may be corrugated. Namely, it may have a bumpy (or uneven) shape to increase light emission efficiency of a pixel by changing a progress path of light emitted from the light emitting device layer EDL. Therefore, the light emission pattern 140 may be expressed as a micro lens, a texturing pattern, a light extraction pattern, light scattering pattern a corrugated micro lens or similar shape.

The light emission pattern 140 according to one embodiment may include a plurality of convex portions 141.

Each of the plurality of convex portions 141 may be provided at the overcoat layer 130 overlapped with the opening portion OP to have a shape which can maximize external emission efficiency of light generated from the pixel based on an effective light emitting area of the light emitting device layer EDL. Each of the plurality of convex portions 141 changes the progress path of the light emitted from the light emitting diode layer EDL to the substrate 100 and therefore increases external emission efficiency of the light emitted from the light emitting device layer EDL. Having the light emitting device layer EDL corrugated also increases its surface area, which increases the amount of light generated.

Each of the plurality of convex portions 141 may be connected with another one in all directions. For example, a bottom (or base) of each of the plurality of convex portions 141 may be connected with bottoms of the convex portions 141 adjacent thereto in all directions. Therefore, the overcoat layer 130 overlapped with the opening portion OP may include a plurality of concave portions 143 formed between the convex portions 141. One concave portion 143 may be surrounded by its adjacent convex portions 141. The plurality of convex portions 141 surrounding one concave portion 143 may be arranged in a hexagon shape in a plane. Having a plurality of the convex portions 141 surrounding the concave portion 143 will result in the area 140 having a honeycomb shape in a top plan view.

Figure 4B:
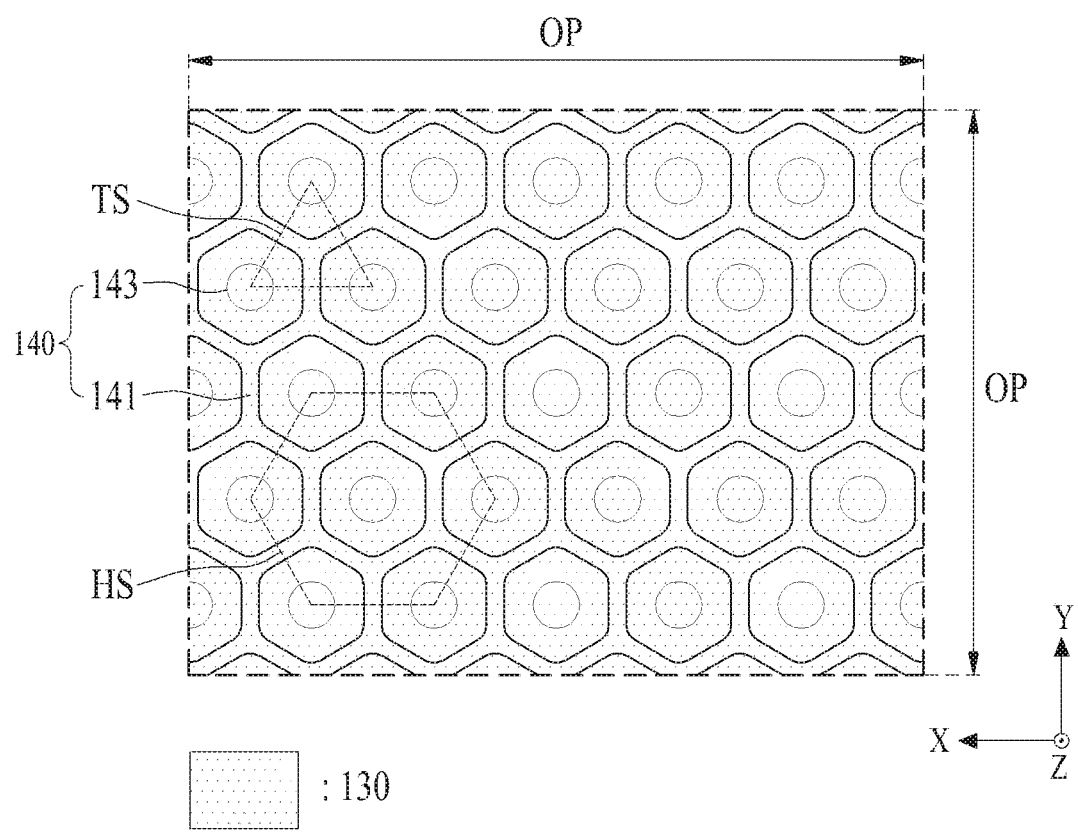
FIG. 4B is a top plan view the structure of FIG. 4A.

FIG. 4B is a top plan view the structure of FIG. 4A. As can be seen, each convex portion 141 is in hexagon shape and is surrounded by concave portions 143 in a hexagon shape to result in a honeycomb pattern within each pixel. Each of the plurality of concave portions 143 may be provided to be recessed from an entire surface 130a of the overcoat layer 130. In this case, the plurality of concave portions 143 may have the same depth based on the entire surface 130a of the overcoat layer 130. In some embodiments, their respective depths might be different from each other based on a desired design choice or as a result of due to a process variations during the patterning process of the light emission pattern 140. The plurality of concave portions 143 may respectively be arranged in parallel with each other along a first direction X to have a certain interval and arranged in a zigzag arrangement along a second direction Y intersecting the first direction X. For example, the plurality of concave portions 143 may be arranged in a lattice shape having a certain interval, and may alternately be arranged along the second direction Y. Therefore, centers of three adjacent concave portions 143 may constitute a triangular shape TS on a plane that is viewed from above the display as a top plan view as shown in FIG. 4B. Also, each of the plurality of concave portions 143 may be surrounded by six concave portions 143 adjacent thereto. At this time, centers of the six concave portions 143 surrounding one convex portion 141 may constitute a hexagon shape HS on a plane that is viewed from above the display as a top plan view as shown in FIG. 4B.

The light emission pattern 140 that includes the plurality of convex portions 141 and the plurality of concave portions 143 may be formed through an etching process of the overcoat layer 130 using a mask pattern after the mask pattern is formed at the overcoat layer 130 over the opening portion OP through a photolithography process using a photoresist. In this case, a positive photoresist may be used as the photoresist to improve productivity.

An interval (or pitch) between peak portions of the convex portions 141 may be equal to or smaller than a diameter of the bottom of the convex portions 141. For example, if the interval between the peak portions of the convex portions 141 is greater than the diameter of the bottom of the convex portions 141, density of the convex portions 141 provided in the opening portion OP of the pixel area PA may be reduced, whereby external emission efficiency of the light emitted from the light emitting device layer EDL may be reduced.

The light emitting device layer EDL may be arranged over the light emission pattern 140 arranged in each of the plurality of pixel areas PA1, PA2 and PA3, emit light in accordance with the data signal supplied from the driving thin film transistor DT of the pixel circuit PC and emit the light to the substrate 100 in accordance with a bottom emission system. The light emitting device layer EDL according to one embodiment includes a first electrode E1, a light emitting element ED, and a second electrode E2. Each of the layers E1, ED and E2 can be conformally deposited sequentially, one after the other, with the first layer, E1 being directly on the overcoat layer 130 and the ED layer on top of it.

The first electrode E1 may be formed over the light emission pattern 140 arranged in each of the plurality of pixel areas PA1, PA2 and PA3 and therefore electrically be connected with the source electrode 118s of the driving thin film transistor DT.

One end of the first electrode E1 may be extended onto the source electrode 118s of the driving thin film transistor DT and electrically connected with the source electrode 118s of the driving thin film transistor DT through a contact hole CH provided in the overcoat layer 130 and the protective layer 119.

Since the other portion except the one end of the first electrode E1 is directly in contact with the light emission pattern 140, it may include morphology (or contour) along a surface morphology of the light emission pattern 140. In this case, since the first electrode E1 is formed (or deposited) over the overcoat layer 130 to have a relative thin thickness, the first electrode E1 may have a contour (or morphology) which conforms to the contour of the light emission pattern 140. For example, the first electrode E1 may have a shape which conforms to the contour of the light emission pattern 140. Therefore, the first electrode E1 may be formed in a conformal morphology, which follows a surface shape (or morphology) of the light emission pattern 140, by a deposition process of a transparent conductive material.

The first electrode E1 may be the anode electrode of the light emitting element ED. The first electrode E1 according to one embodiment may include a transparent conductive material such as transparent conductive oxide (TCO) to allow light emitted from the light emitting element ED to be transmitted toward the substrate 100. For example, the first electrode E1 may be made of Indium Tin Oxide (ITO) or Indium Zinc Oxide (IZO).

The light emitting element ED may be formed over the first electrode E1 and therefore electrically connected with the first electrode E1. The light emitting element ED according to one embodiment may include any one of an organic light emitting layer, an inorganic light emitting layer and a quantum dot light emitting layer, or may include a deposited or mixed structure of an organic light emitting layer (or inorganic light emitting layer) and a quantum dot light emitting layer. In this case, the light emitting element ED may be formed (or deposited) over the first electrode E1 to have a thickness relatively thicker than that of the first electrode E1 and therefore may have a surface morphology different from that of each of the convex portions 141 or the first electrode E1. For example, the light emitting element ED may have a first thickness over an upper area including the peak portion of the convex portions 141, and may have a second thickness thicker than the first thickness over the bottom of the convex portions 141. Therefore, the light emitting element ED may have an effective light emitting area and a non-effective light emitting area in accordance with its thickness. The effective light emitting area of the light emitting element ED may be set to an upper area of the convex portions 141, and the non-effective light emitting area of the light emitting element ED may be set to a lower area of the convex portions 141.

The light emitting element ED according to one embodiment may include any one of a blue light emitting layer, a green light emitting layer and a red light emitting layer. For example, if unit pixel includes first to third pixels 12a, 12b and 12c, the light emitting element ED arranged in the first pixel area PA1 may include a red light emitting layer, the light emitting element ED arranged in the second pixel area PA2 may include a green light emitting layer, and the light emitting element ED arranged in the third pixel area PA3 may include a blue light emitting layer. In this case, the light emitting element ED of each of the first to third pixels 12a, 12b and 12c may be arranged over only the first electrode E1 overlapped with the opening portion OP of each of the pixel areas PA1, PA2 and PA3.

The light emitting element ED according to another embodiment includes two or more light emitting portions for emitting white light. For example, if the unit pixel includes first to third pixels 12a, 12b and 12c, the light emitting element ED each of the first to third pixels 12a, 12b and 12c may include first and second light emitting portions for emitting white light by means of mixture of the first light and the second light. The first light emitting portion according to one embodiment emits the first light and may include any one of a blue light emitting portion, a green light emitting portion, a red light emitting portion, a yellow light emitting portion, and a yellowish green light emitting portion. The second light emitting portion according to one embodiment may include any one, except the first light emitting portion, of the blue light emitting portion, the green light emitting portion, the red light emitting portion, the yellow light emitting portion, and the yellowish green light emitting portion. In this case, the light emitting element ED is a common layer of the first to third pixels 12a, 12b and 12c, and may be arranged not only over the first electrode E1 overlapped with the opening portion OP of each of the pixel areas PA1, PA2 and PA3 but also to overlap the circuit portion CP of each of the pixel areas PA1, PA2 and PA3.

The second electrode E2 may be formed over the light emitting element ED and directly be in contact with the light emitting element ED. The second electrode E1 according to one embodiment may be formed (or deposited) over the light emitting element ED to have a thickness relatively thinner than the light emitting element ED. Therefore, since the second electrode E2 is formed (or deposited) over the light emitting element ED to have a relatively thin thickness, it may have a surface morphology that follows a surface morphology of the light emitting element ED as it is. For example, the second electrode E2 may have a shape which conforms to the contour of the light emitting element ED.

The second electrode E2 according to one embodiment may be the cathode electrode of the light emitting element ED. The second electrode E2 according to one embodiment may include a metal material of high reflectance to reflect light, which is emitted from the light emitting element ED and enters the second electrode E2, toward the substrate 100. For example, the second electrode E2 may be formed of a multi-layered structure such as a deposited structure (Ti/Al/Ti) of aluminum (Al) and titanium (Ti), a deposited structure (ITO/Al/ITO) of Al and ITO, an APC (Ag/Pd/Cu) alloy, and a deposited structure (ITO/APC/ITO) of APC alloy and ITO, or may include a single layered structure made of a material of any one or an alloy material of two or more selected from Ag, Al, Mo, Au, Mg, Ca and Ba.

The light emitting display panel 10 according to the present disclosure may further include a bank pattern 150 and an encapsulation layer 160.

The bank pattern 150 defines the opening portion OP of each of the pixel areas PA1, PA2 and PA3, and may be provided over the corner of the first electrode E1 and the overcoat layer 130. For example, the bank pattern 150 may be formed of an organic material such as benzocyclobutene (BCB) resin, acryl resin or polyimide resin. Alternatively, the bank pattern 150 may be formed of a photoresist that includes a black pigment, and in this case, the bank pattern 150 may serve as a light shielding member that prevents a color mixture among the adjacent pixels 12a, 12b and 12c from occurring.

Each of the light emitting element ED and the second electrode E2 of the light emitting device layer EDL may be formed over the bank pattern 150. That is, the light emitting element ED may be formed to overlay the corner of the first electrode E1 and the bank pattern 150, and the second electrode E2 may be formed to overlay the light emitting element ED.

The encapsulation layer 160 may be formed over the substrate 100 to overlay the second electrode E2, that is, the entire pixels. The encapsulation layer 160 may serve to protect the thin film transistor and the light emitting element ED from external impact and prevent oxygen and/or water and particles from being permeated into the light emitting device layer EDL.

The encapsulation layer 160 according to one embodiment may include at least one inorganic film. The encapsulation layer 160 may further include at least one organic film. For example, the encapsulation layer 160 may include a first inorganic encapsulation layer, an organic encapsulation layer, and a second inorganic encapsulation layer. The first and second inorganic encapsulation layers may include any one inorganic material of a silicon oxide film (SiOx), a silicon nitride film (SiNx), a silicon oxynitride film (SiON), a titanium oxide film (TiOx), and an aluminum oxide film (AlOx). The organic encapsulation layer may be made of any one organic material of acryl resin, epoxy resin, phenolic resin, polyamide resin, polyimide resin, and benzocyclobutene resin. The organic encapsulation layer may be expressed as a particle overlay layer.

Optionally, the encapsulation layer 160 may be modified to a filling member surrounding all the pixels. In this case, the light emitting display panel 10 according to the present disclosure further includes an encapsulation substrate 170 attached onto the substrate 100 by using the filling member as a medium. The encapsulation substrate 170 may be made of a plastic material, a glass material, or a metal material. The filling member may include a getter material that absorbs oxygen or/and water.

Additionally, if the light emitting element ED according to one embodiment of the present disclosure emits white light, the light emitting display panel 10 according to the present disclosure may further include wavelength conversion layers 120a, 120b and 120c arranged to overlap the opening portion OP of each of the pixel areas PA1, PA2 and PA3.

The wavelength conversion layers 120a, 120b and 120c may be provided between the substrate 100 and the overcoat layer 130 to overlap the opening portion OP. As an example, the wavelength conversion layers 120a, 120b and 120c may be provided between the protective layer 119 and the overcoat layer 130 to overlap the opening portion OP. As another embodiment, the wavelength conversion layers 120a, 120b and 120c may be provided between the insulating interlayer 117 and the protective layer 119 to overlap the opening portion OP, or may be provided between the substrate 100 (or buffer layer 110) and the insulating interlayer 117 to overlap the opening portion OP.

The wavelength conversion layers 120a, 120b and 120c according to one embodiment may include color filters for transmitting only a wavelength (or light) of a color set in the pixel among the lights emitted from the light emitting element ED to the substrate 100. For example, the wavelength conversion layers 120a, 120b and 120c may include a red color filter overlapped with the opening portion OP of the first pixel area PA1, a green color filter overlapped with the opening portion OP of the second pixel area PA2, and a blue color filter overlapped with the opening portion OP of the third pixel area PA3.

The wavelength conversion layers 120a, 120b and 120c according to another embodiment may include a quantum dot having a size for emitting light of a color set in the pixel by re-emitting light in accordance with the light emitted from the light emitting element ED of the corresponding pixels 12a, 12b and 12c to the substrate 100. The quantum dot according to one embodiment may be selected from CdS, CdSe, CdTe, CdZnSeS, ZnS, ZnSe, GaAs, GaP, GaAs—P, Ga—Sb, InAs, InP, InSb, AlAs, AlP and AlSb to emit the light of the color set in the pixel. For example, the wavelength conversion layers 120a, 120b and 120c may include a red quantum dot pattern overlapped with the opening portion OP of the first pixel area PA1, a green quantum dot pattern overlapped with the opening portion OP of the second pixel area PA2, and a blue quantum dot pattern overlapped with the opening portion OP of the third pixel area PA3. As an example, the red quantum dot pattern may include a quantum dot of CdSe or InP, the green quantum dot pattern may include a quantum dot of CdZnSeS, and the blue quantum dot pattern may include a quantum dot of ZnSe. In this way, the light emitting display apparatus in which the wavelength conversion layers 120a, 120b and 120c include quantum dots may have a high color reproduction rate.

The wavelength conversion layers 120a, 120b and 120c according to other example may include a red color filter containing a red quantum dot, a green color filter 120b containing a green quantum dot, and a blue color filter containing a blue quantum dot. In this case, the red color filer may not contain a red quantum dot to reduce transmittance of light of a long wavelength.

The selective wavelength absorbing member 180 may be arranged to overlap at least one of the plurality of pixel areas PA1, PA2 and PA3. The selective wavelength absorbing member 180 will reduce diffuse reflectance for light of a long wavelength (or a long wavelength area which is incident on its surface. In particular, the selective wavelength absorbing member 180 will reduce the diffuse reflection of that light that is emitted by the light emitting device layer EDL as it exits from the display panel 10. In some embodiments, the selective wavelength absorbing member will absorb all light that is within the selected wavelength, including direct light, reflected light, diffused light and diffused reflected light. Doing this will serve to improve the visual characteristic of a black image, and may increase a color temperature by reducing transmittance (or external emission rate) of the light of the long wavelength and therefore improve white balance according to the color temperature and target luminance set through the color temperature.

The light emission pattern 140 according to this example may be arranged in each of the pixel areas PA1, PA2 and PA3 to emit light confined in the display panel 10 toward the outside, thereby improving light efficiency. However, the light emission pattern 140 may increase diffuse reflectance by scattering external light, thereby causing side effects for deteriorating visual characteristic of the black image. Therefore, according to diffuse reflectance spectrum per wavelength for external light of the light emission pattern 140 provided in each pixel, since transmittance of red light of the red color filter is relatively high, a color reproduction rate may be deteriorated due to a long wavelength (for example, 600 nm to 740 nm) that transmits the red color filter, and visual characteristic of the black image may be deteriorated. Therefore, the selective wavelength absorbing member 180 may be applied to improve visual characteristic of the black image according to diffuse reflectance without reducing light efficiency (or luminance) by reducing diffuse reflectance for the light of the long wavelength that most largely contributes to diffuse reflectance spectrum per wavelength.

The selective wavelength absorbing member 180 may be embodied to reduce transmittance of a red wavelength which is incident. The selective wavelength absorbing member 180 according to one embodiment may be embodied to reduce diffuse reflectance of a long wavelength of 640 nm to 680 nm. For example, the selective wavelength absorbing member 180 may be embodied to include a long wavelength absorption dye that absorbs light of the long wavelength.

The long wavelength absorption dye may include an absorbent that absorbs a wavelength of 640 nm to 680 nm. For example, if the long wavelength absorption dye has an absorption wavelength less than 640 nm close to a red peak wavelength, as the red peak wavelength is absorbed in the long wavelength absorption dye, red luminance efficiency may be reduced, whereby white luminance efficiency may be reduced. If the long wavelength absorption dye has an absorption wavelength of 680 nm or more beyond the red peak wavelength, a reduction rate of the red luminance efficiency according to long wavelength absorption of the long wavelength absorption dye is reduced but a color temperature may be increased and selective wavelength absorbing effect of the long wavelength may be reduced. Therefore, considering red luminance efficiency and color temperature and reflectance reduction of the long wavelength, it may be most effective that the absorption wavelength of the long wavelength absorption dye is set to 640 nm to 680 nm, but is not limited to the wavelength range, the absorption wavelength of the long wavelength absorption dye is set to 600 nm-740 nm.

The selective wavelength absorbing member 180 according to one embodiment may include a selective wavelength absorbing film (or long wavelength absorption film) that includes a longwave absorption dye that absorbs light of the long wavelength. In this case, the selective wavelength absorbing film may be attached to a rear surface (or second surface) opposite to a front surface (or first surface) of the substrate 100. For example, the selective wavelength absorbing film may be attached to the rear surface of the substrate 100 by a transparent adhesive member. The selective wavelength absorbing film may be overlapped with all of the plurality of pixels 12a, 12b and 12c arranged over the first surface of the substrate 100 to absorb light of a longwave length area of externally incident light and external emission light (or external reflective light) incident from the first pixel 12a through the substrate 100, whereby diffuse reflectance of the long wavelength may be reduced.

The selective wavelength absorbing member 180 according to another embodiment may include a selective wavelength absorbing coating layer (or long wavelength absorption coating layer) that includes a longwave absorption dye that absorbs light of the long wavelength. In this case, the selective wavelength absorbing coating layer may be coated over the entire rear surface of the substrate 100 at a certain thickness or coated over the rear surface of the substrate 100 overlapped with the first pixel 12a (or red pixel) in an island shape. The selective wavelength absorbing coating layer may be overlapped with all of the plurality of pixels 12a, 12b and 12c arranged over the first surface of the substrate 100 or overlapped with only the red pixel to absorb light of a longwave length area of externally incident light and external emission light (or external reflective light) incident from the first pixel 12a through the substrate 100, whereby diffuse reflectance of the long wavelength may be reduced.

The long wavelength absorption dye may include an absorbing material that absorbs a wavelength of 640 nm to 680 nm. For example, the long wavelength absorption dye may include at least one absorbing material of 9-(2-Carboxyphenyl)-6-(N,N-diethylamino)-4-[(N-ethylcarbazol-3-yl)methylidenyl]-1,2,3,4- tetrahydroxanthylium perchlorate of a chemical formula 1 and 9-(2-Carboxyphenyl)-6-(N,N-diethylamino)-4-[7-(N,N-diethylamino)benzo[e]pyran-2-on-3-yl)methylidenyl]-1,2,3,4-tetrahydroxanthylium perchlorate of a chemical formula 2.

[Chemical formula 1]

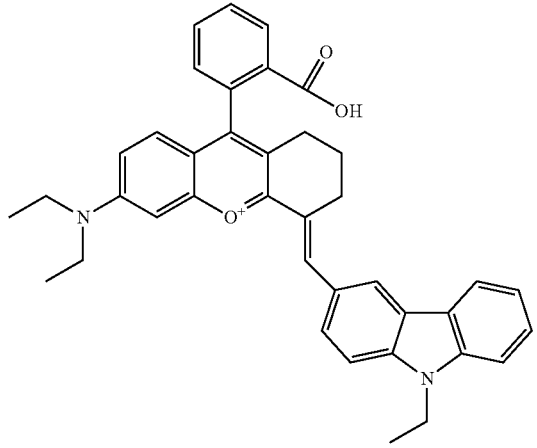

A maximum absorption wavelength of the long wavelength absorption dye according to the chemical formula 1 may be 647 nm.

[Chemical formula 2]

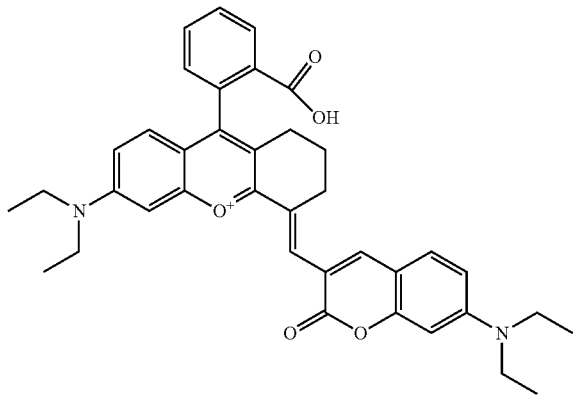

A maximum absorption wavelength of the long wavelength absorption dye according to the chemical formula 2 may be 678 nm.

As the selective wavelength absorbing member 180 includes a long wavelength absorption dye that absorbs light of a long wavelength which most contributes to diffuse reflectance, transmittance of the long wavelength (for example, 640 nm to 680 nm) of a white spectrum may be reduced to increase a color temperature, whereby white balance may be improved. Therefore, the light emitting display apparatus according to the present disclosure may embody normal white luminance of 150 lx or more and peak white luminance of 500 lx or more, particularly embody normal white luminance of maximum 180 lx and peak white luminance of maximum 593 lx while including the light emission pattern 140.

Additionally, the light emitting display panel 10 according to the present disclosure may further include a polarizing film 190 attached to the selective wavelength absorbing member 180.

The polarizing film 190 may be attached to the rear surface of the selective wavelength absorbing member 180 by a transparent adhesive layer. When the selective wavelength absorbing member 180 is made of the selective wavelength absorbing film, the transparent adhesive layer may be interposed between the selective wavelength absorbing film and the polarizing film 190. When the selective wavelength absorbing member 180 is made of the selective wavelength absorbing coating layer, the transparent adhesive layer may partially be interposed between the selective wavelength absorbing coating layer and the polarizing film 190, and the other transparent adhesive layer may be interposed between the rear surface of the substrate 100, which is exposed between the selective wavelength absorbing coating layers, and the polarizing film 190. The polarizing film 190 improves visibility and contrast ratio of the light emitting display panel 10 by changing external light reflected by the thin film transistor and/or lines provided in each of the pixels 12a, 12b and 12c to a circularly polarized state. The polarizing film 190 according to one embodiment may be embodied to have light transmittance of 40% or more while reducing light transmittance between green and red, which correspond to a wavelength of 580 nm to 620 nm, whereby visibility and contrast ratio of the light emitting display panel may be improved and color reproduction rate may be increased.

Additionally, the polarizing film 190 may be formed in a single body with the rear surface of the selective wavelength absorbing member 180. That is, the selective wavelength absorbing member 180 may be embedded in the polarizing film 190. In this case, the polarizing film integrated (or embedded) with the selective wavelength absorbing member 180 may be defined as a long wavelength absorption polarizing film.

In the light emitting display apparatus according to one embodiment of the present disclosure, a path of light emitted from the light emitting element ED may be changed by the light emission pattern 140 provided in the pixel areas PA1, PA2 and PA3, and thus, light emission efficiency and luminance may be improved, and power consumption may be reduced. Also, in the light emitting display apparatus according to one embodiment of the present disclosure, as diffuse reflectance for light of the long wavelength is reduced by the selective wavelength absorbing member 180 overlapped with at least one of the pixel areas PA1, PA2 and PA3, whereby a color temperature is increased, whereby white balance may be improved, and visual characteristic of the black image may be improved. Also, in the light emitting display apparatus according to one embodiment of the present disclosure, degradation of the driving transistor is compensated by increase of the color temperature according to reduction of transmittance of the long wavelength, whereby luminance may be increased when white color tracking for adjusting a target color temperature and white target luminance is applied.

Figure 5:
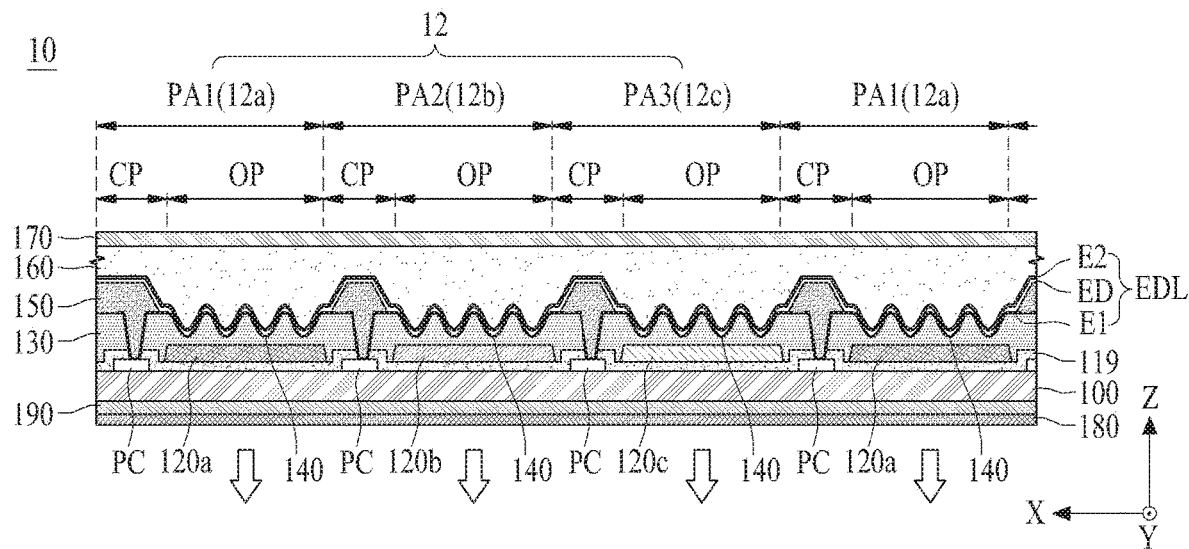
FIG. 5 is a view illustrating a modified example of a display panel according to one embodiment, which is shown in FIG. 3.

FIG. 5 is a view illustrating a modified example of a display panel according to one embodiment, which is shown in FIG. 3. In FIG. 5, an arrangement structure of the selective wavelength absorbing member and the polarizing film is modified. Therefore, the same reference numerals are given to the other elements except the selective wavelength absorbing member and its related elements, and repeated description according to the same elements will be omitted.

Referring to FIG. 5, in the display panel 10 according to the modified example of the present disclosure, the polarizing film 190 may be attached to the rear surface (or second surface) of the substrate 100. For example, the polarizing film 190 may be attached to the entire rear surface of the substrate 100 by a transparent adhesive layer.

Since the selective wavelength absorbing member 180 is substantially the same as the selective wavelength absorbing member shown in FIGS. 3 and 4 except that it is arranged over the rear surface of the polarizing film 190, its description will briefly be given.

The selective wavelength absorbing member 180 may be arranged over the rear surface of the polarizing film 190 to overlap at least one of the plurality of pixel areas PA1, PA2 and PA3 and reduce diffuse reflectance for light of a long wavelength, which is incident.

The selective wavelength absorbing member 180 according to one embodiment may include a selective wavelength absorbing film (or long wavelength absorption film) attached to the entire rear surface of the polarizing film 190, including a long wavelength absorption dye for absorbing light of the long wavelength. For example, the selective wavelength absorbing film may be attached to the rear surface of the polarizing film 190 by a transparent adhesive member.

The selective wavelength absorbing member 180 according to another embodiment may include a selective wavelength absorbing coating layer (or long wavelength absorption coating layer) coated over the entire rear surface of the substrate 100 at a certain thickness or coated over the rear surface of the substrate 100 overlapped with the first pixel 12a (or red pixel) in an island shape, including a long wavelength absorption dye for absorbing light of the long wavelength.

Additionally, the selective wavelength absorbing member 180 may be formed in a single body with the rear surface of the polarizing film 190. That is, the selective wavelength absorbing member 180 may be embedded in the polarizing film 190. In this case, the polarizing film integrated (or embedded) with the selective wavelength absorbing member 180 may be defined as a long wavelength absorption polarizing film.

The light emitting display apparatus according to the modified example of the present disclosure, which comprises the display panel 10, may have the same effects as those of the light emitting display apparatus shown in FIGS. 3 and 4.

Figure 6:
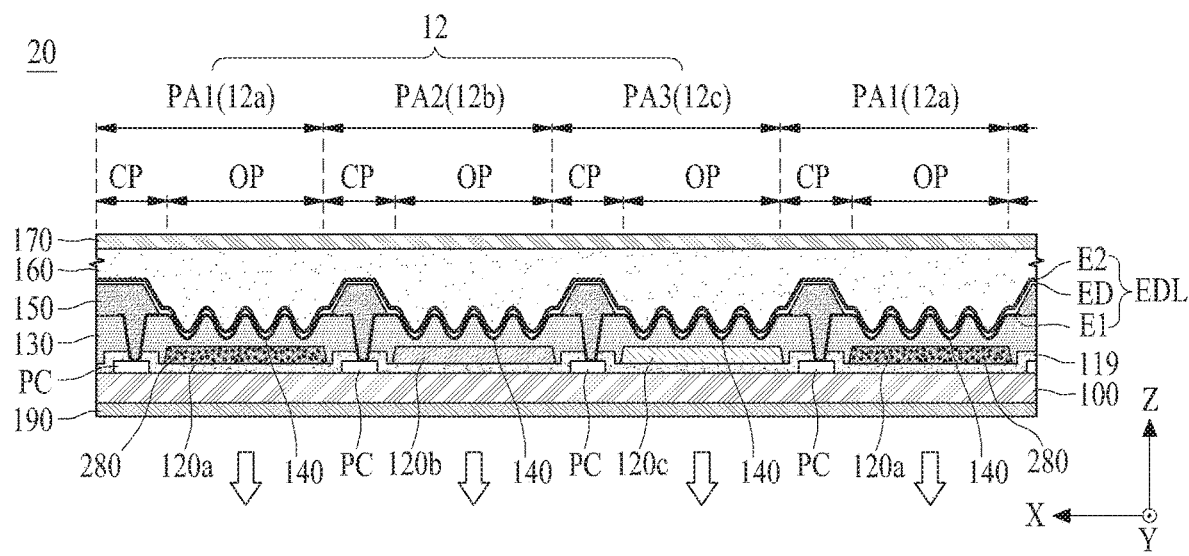
FIG. 6 is a view illustrating a display panel according to another embodiment of the present disclosure.

FIG. 6 is a view illustrating a display panel 20 according to another embodiment of the present disclosure. In FIG. 6, the selective wavelength absorbing member is arranged inside a pixel in the display panel shown in FIGS. 3 and 4. Therefore, the same reference numerals are given to the other elements except the selective wavelength absorbing member and its related elements, and repeated description according to the same elements will be omitted.

Referring to FIG. 6, in the display panel 20 according to another embodiment of the present disclosure, the selective wavelength absorbing member 280 may reduce diffuse reflectance for light of a long wavelength, which is incident by being contained in the wavelength conversion layer 120a arranged in the first pixel area PA1 (or the first pixel 12a) of the plurality of pixel areas PA1, PA2 and PA3. That is, the wavelength conversion layer 120a arranged in the first pixel area PA1 may include a wavelength conversion material mixed with the selective wavelength absorbing member 280.

The selective wavelength absorbing member 280 according to one embodiment may include a long wavelength absorption dye that absorbs a long wavelength of 640 nm to 680 nm. For example, the long wavelength absorption dye may include at least one absorbing material of the chemical formula 1 and the chemical formula 2. Therefore, in the display panel 20 according to another embodiment of the present disclosure, the wavelength conversion layer 120a arranged in the first pixel area PA1 (or red pixel 12a) may include a long wavelength absorption dye that absorbs a long wavelength of 640 nm to 680 nm mixed with at least one wavelength conversion material of a red color filter and a red quantum dot pattern.

The selective wavelength absorbing member 280 contained in the wavelength conversion layer 120a may absorb light of the long wavelength, which is incident, to reduce transmittance (or external emission rate) for the light of the long wavelength and increase a color temperature, whereby target luminance which is set and white balance according to the color temperature may be improved, and visual characteristic of a black image may be improved.

In the display panel 20 according to another embodiment of the present disclosure, the polarizing film 190 may be attached to the rear surface of the substrate 100 as the selective wavelength absorbing member 280 is included in the wavelength conversion layer 120a arranged in the first pixel area PA1.

The light emitting display apparatus according to another embodiment of the present disclosure, which comprises the display panel 20, may have the same effects as those of the light emitting display apparatus shown in FIGS. 3 and 4.

Figure 7:
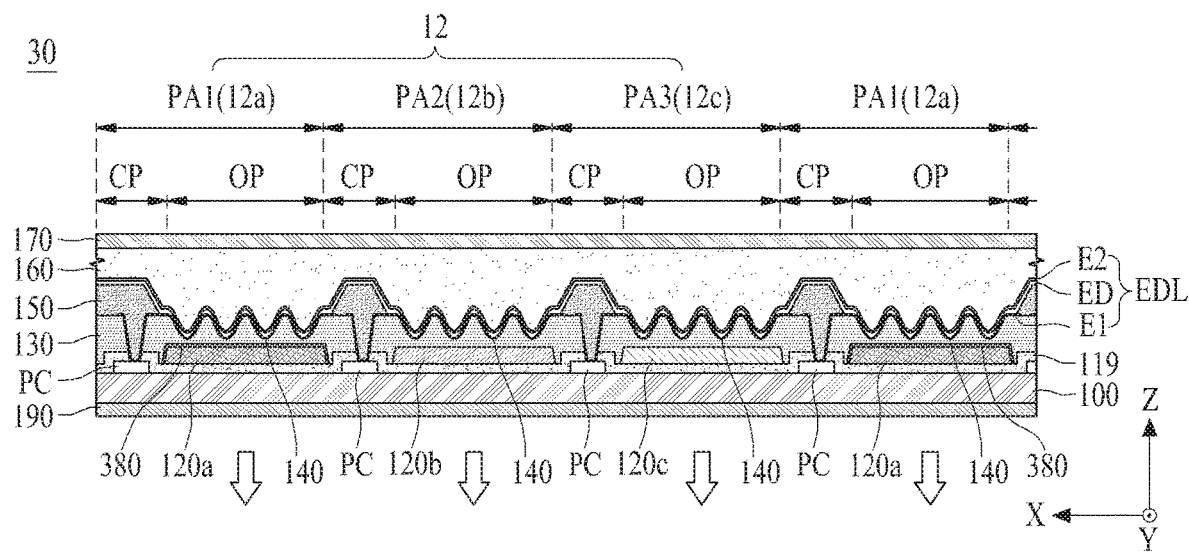
FIGS. 7 to 12 are views illustrating a display panel according to other embodiment of the present disclosure.

FIG. 7 is a view illustrating a display panel 30 according to still another embodiment of the present disclosure. In FIG. 7, the selective wavelength absorbing member is arranged inside a pixel. Therefore, the same reference numerals are given to the other elements except the selective wavelength absorbing member and its related elements, and repeated description according to the same elements will be omitted.

Referring to FIG. 7, in the display panel 30 according to still another embodiment of the present disclosure, the selective wavelength absorbing member 380 may be arranged between the substrate 100 and the overcoat layer 130 to overlap at least one of the plurality of pixel areas PA1, PA2 and PA3 to reduce diffuse reflectance for light of the long wavelength, which is incident. To this end, the selective wavelength absorbing member 380 may include a long wavelength absorption dye that absorbs a long wavelength of 640 nm to 680 nm. For example, the long wavelength absorption dye may include at least one absorbing material of the chemical formula 1 and the chemical formula 2.

The selective wavelength absorbing member 380 according to one embodiment may be arranged between the wavelength conversion layer 120a arranged in the first pixel area PA1 of the plurality of pixel areas PA1, PA2 and PA3 and the overcoat layer 130. As an example, the selective wavelength absorbing member 380 may be arranged between the front surface of the wavelength conversion layer 120a and the overcoat layer 130. As another embodiment, the selective wavelength absorbing member 380 may be arranged to surround a front surface and sides of the wavelength conversion layer 120a and surrounded by the overcoat layer 130. If the selective wavelength absorbing member 380 surrounds the wavelength conversion layer 120a, red light progressing to the outside and adjacent pixels through the sides of the wavelength conversion layer 120a may be reduced.

The selective wavelength absorbing member 380 according to another embodiment may be arranged between the wavelength conversion layers 120a, 120b and 120c respectively arranged in the plurality of pixel areas PA1, PA2 and PA3 and the overcoat layer 130. For example, the selective wavelength absorbing member 380 according to another embodiment may be coated over the substrate 100 to overlay all of the wavelength conversion layers 120a, 120b and 120c respectively arranged in the plurality of pixel areas PA1, PA2 and PA3 and the protective layer 119. In this case, the selective wavelength absorbing member 380 may be formed by a coating process of one time for the entire surface of the substrate 100 without a separate patterning process, whereby the process of forming the selective wavelength absorbing member 380 may be simplified.

In the display panel 30 according to still another embodiment of the present disclosure, the polarizing film 190 may be attached to the rear surface of the substrate 100 as the selective wavelength absorbing member 380 is arranged between the substrate 100 and the overcoat layer 130.

The light emitting display apparatus according to still another embodiment of the present disclosure, which comprises the display panel 30, may have the same effects as those of the light emitting display apparatus shown in FIGS. 3 and 4.

Figure 8:
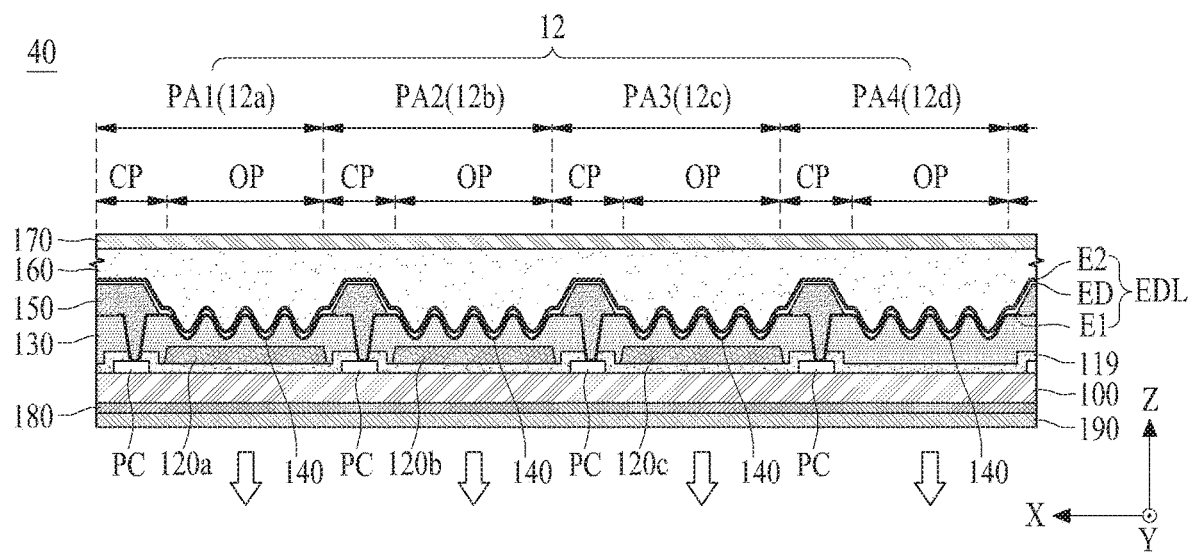

FIG. 8 is a view illustrating a display panel 40 according to further still another embodiment of the present disclosure. In FIG. 8, a white pixel is additionally arranged in unit pixel of the display panel shown in FIGS. 1 to 4. Therefore, the same reference numerals are given to the other elements except the white pixel and its related elements, and repeated description according to the same elements will be omitted.

Referring to FIG. 8, the display panel 40 according to further still another embodiment of the present disclosure may include a plurality of pixel areas PA1, PA2, PA3 and PA4 defined by a plurality of gate lines and a plurality of data lines, having a circuit portion CP and an opening portion OP, and a plurality of pixels 12a, 12b, 12c and 12d arranged in the plurality of pixel areas PA1, PA2, PA3 and PA4.

Four adjacent pixel areas of the plurality of pixel areas PA1, PA2, PA3 and PA4 may constitute one unit pixel area. For example, one unit pixel area may include first to fourth pixel areas PA1, PA2, PA3 and PA4. In this case, the first pixel area PA1 may be a red pixel area, the second pixel area PA2 may be a green pixel area, the third pixel area PA3 may be a blue pixel area, and the fourth pixel area PA4 may be a white pixel area, but is not limited thereto.

The circuit portion CP may be defined as a transistor area defined in each of the plurality of pixel areas PA1, PA2, PA3 and PA4. The opening portion OP may be defined as a light emission area through which light emitted from the light emitting device layer EDL arranged in each of the plurality of pixel areas PA1, PA2, PA3 and PA4 is emitted to the outside.

Four adjacent pixels of the plurality of pixels 12a, 12b, 12c and 12d may constitute one unit pixel 12 for color display.

One unit pixel 12 may include four pixels 12a, 12b, 12c and 12d arranged to adjoin one another along a length direction of the gate line. For example, one unit pixel 12 may include first to fourth pixels 12a, 12b, 12c and 12d. In this case, the first pixel 12a may be a red pixel, the second pixel 12b may be a green pixel, the third pixel 12c may be a blue pixel, and the fourth pixel 12d may be a white pixel. The white pixel may be arranged between the blue pixel and the red pixel of the unit pixel 12, which is adjacent to the blue pixel. However, without limitation to this example, the white pixel may be arranged between the red pixel and the green pixel within the unit pixel 12.

Light emitting diodes of the first to fourth pixels 12a, 12b, 12c and 12d according to one embodiment may emit the same white light. In this case, the first to third pixels 12a, 12b and 12c may include their respective wavelength conversion layers 120a, 120b and 120c for converting white light to their respective colored lights. The fourth pixel 12d may emit white light to the substrate 100 without including the wavelength conversion layer.

Since the first to third pixels 12a, 12b and 12c are substantially the same as the first to third pixels of the display panel shown in FIGS. 1 to 4, their repeated description will be omitted.

Since the fourth pixel 12d is substantially the same as the first to third pixels 12a, 12b and 12c except that it does not include the wavelength conversion layers 120a, 120b and 120c, its repeated description will be omitted.

Since the fourth pixel 12d includes the light emission pattern 140 without the wavelength conversion layer, the fourth pixel 12d most largely affects diffuse reflectance spectrum per wavelength due to light scattering according to the light emission pattern 140. For example, considering diffuse reflectance per pixel, since most of white light reflected by the light emission pattern 140 is emitted toward the substrate 100 without filtering in the fourth pixel 12d unlike the first to third pixels 12a, 12b and 12c having the wavelength conversion layers 120a, 120b and 12c, the fourth pixel 12d may have diffuse reflectance higher than that of the first pixel 12a. Therefore, since diffuse reflectance of the fourth pixel 12d occupies the largest percentage in diffuse reflectance of the display panel 40, diffuse reflectance of the display panel 40 may be increased to cause side effects for deteriorating visual characteristic of a black image. Since the red light, for example, a long wavelength of 640 nm to 680 nm most largely affects diffuse reflectance per wavelength of the display panel 40, diffuse reflectance of the display panel 40 may be increased by the long wave length area of the white light emitted from the fourth pixel 12d, whereby a color temperature may be reduced.

Since the display panel 40 according to further still another embodiment of the present disclosure includes the selective wavelength absorbing member 180 overlapped with the first pixel 12a and the fourth pixel 12d, transmittance of the long wavelength of the spectrum of the white light emitted from the fourth pixel 12d to the outside as well as transmittance of the long wavelength of the spectrum of the red light emitted from the first pixel 12a to the outside may be reduced by the selective wavelength absorbing member 180 to reduce diffuse reflectance, whereby a color temperature may be increased.

Since the selective wavelength absorbing member 180 according to this example is substantially the same as the selective wavelength absorbing member shown in FIGS. 3 and 4 except that it is additionally overlapped with the fourth pixel 12d (or white pixel) arranged in the unit pixel 12, the same reference numeral is given to the corresponding elements and its repeated description according to the same elements will be omitted.

Since the light emitting display apparatus, which comprises the display panel 40, according to another embodiment of the present disclosure is substantially the same as the light emitting display apparatus, which comprises the display panel 10 shown in FIGS. 3 and 4 except that the white pixel 12d is additionally arranged in the unit pixel 12, it may have the same effects as those of the light emitting display apparatus shown in FIGS. 3 and 4 and transmittance of the long wavelength of the spectrum of the white light emitted from the white pixel 12d to the outside may be reduced due to the selective wavelength absorbing member 180 to reduce diffuse reflectance, whereby a color temperature may be increased. For this reason, white balance may be improved and visual characteristic of a black image may be improved.

Optionally, in the display panel 40, according to another embodiment of the present disclosure, the fourth pixel (or the white pixel) 12d may include the wavelength conversion layer overlapped with the opening portion OP of the fourth pixel area PA4. In one example, the wavelength conversion layer of the fourth pixel 12d may include at least one of a red color filter, a green color filter, and a blue color filter. In another example, the wavelength conversion layer of the fourth pixel 12d may include at least one of a red color filter containing a red quantum dot, a green color filter containing a green quantum dot, and a blue color filter containing a blue quantum dot. In this case, the red color filer may not contain a red quantum dot to reduce transmittance of light of a long wavelength. In this case, since most of white light reflected by the light emission pattern 140 is filtered by the wavelength conversion layer and emitted toward the substrate 100, the diffuse reflectance at the fourth pixel 12d may be reduced.

Figure 9:
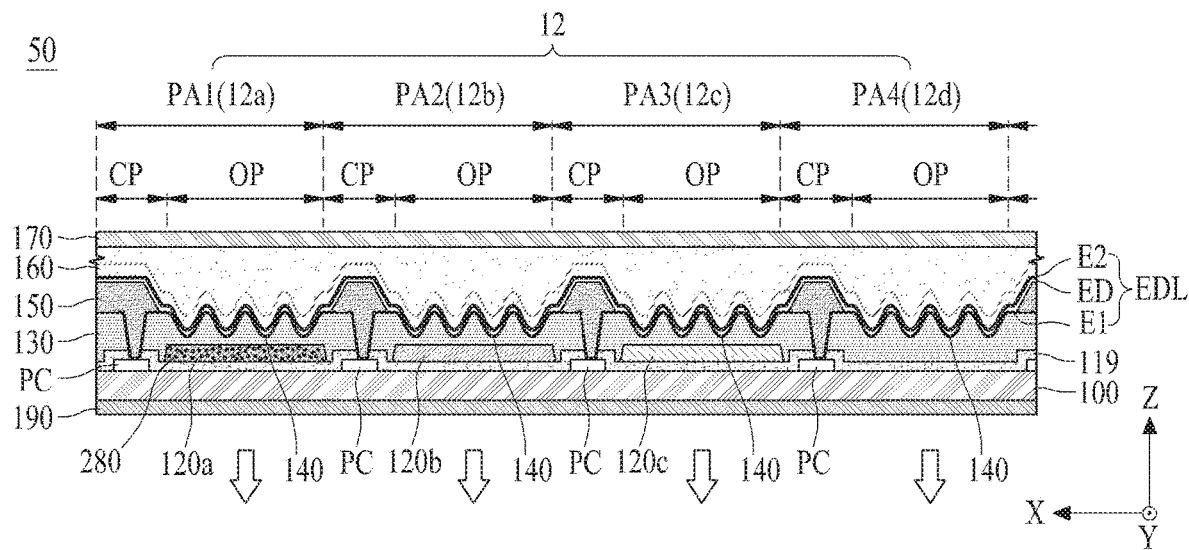

FIG. 9 is a view illustrating a display panel 50 according to further still another embodiment of the present disclosure. In FIG. 9, the selective wavelength absorbing member in the display panel shown in FIG. 8 is arranged inside the red pixel. Therefore, the same reference numerals are given to the other elements except the selective wavelength absorbing member and its related elements, and repeated description according to the same elements will be omitted.

Referring to FIG. 9, in the display panel 50 according to further still another embodiment of the present disclosure, the selective wavelength absorbing member 280 may reduce diffuse reflectance for light of a long wavelength, which is incident by being contained in the wavelength conversion layer 120a arranged in the first pixel area PA1 (or the first pixel 12a) of the plurality of pixel areas PA1, PA2, PA3 and PA4. That is, the wavelength conversion layer 120a arranged in the first pixel area PA1 may include a wavelength conversion material mixed with the selective wavelength absorbing member 280. Since the display panel 50 according to further still another embodiment of the present disclosure is substantially the same as the display panel 20 according to another embodiment of the present disclosure shown in FIG. 6 except the unit pixel 12 further includes the fourth pixel 12d (or white pixel), its repeated description will be omitted.

Figure 10:
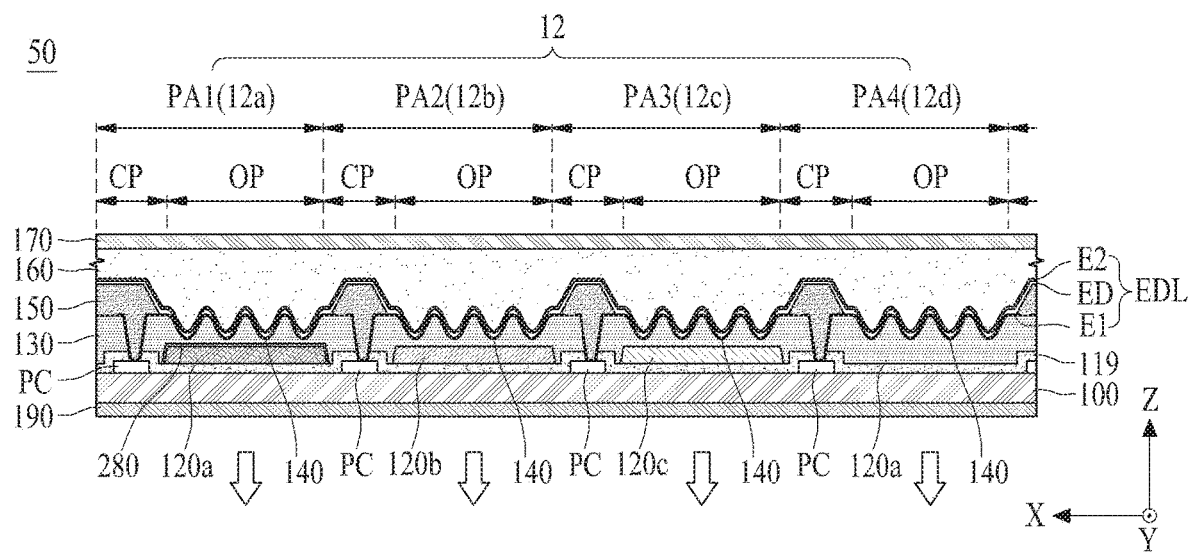

Optionally, in the display panel 50 according to further still another embodiment of the present disclosure, as shown in FIG. 10, the selective wavelength absorbing member 280 may be arranged between the wavelength conversion layer 120a arranged in the first pixel area PA1 (or the first pixel 12a) and the overcoat layer 130 to reduce diffuse reflectance for light of a long wavelength, which is incident. This selective wavelength absorbing member 280 is formed to surround the wavelength conversion layer 120a arranged in the red pixel 12a. Since this selective wavelength absorbing member 280 is substantially the same as the selective wavelength absorbing member 380 shown in FIG. 7, its repeated description will be omitted.

Since the light emitting display apparatus according to further still another embodiment of the present disclosure, which comprises the display panel 50, comprises the selective wavelength absorbing member 280 contained in the wavelength conversion layer 120a arranged in the red pixel 12a or arranged to surround the wavelength conversion layer 120a arranged in the red pixel 12a, it may have the same effects as those of the light emitting display panel shown in FIG. 8.

Figure 11:
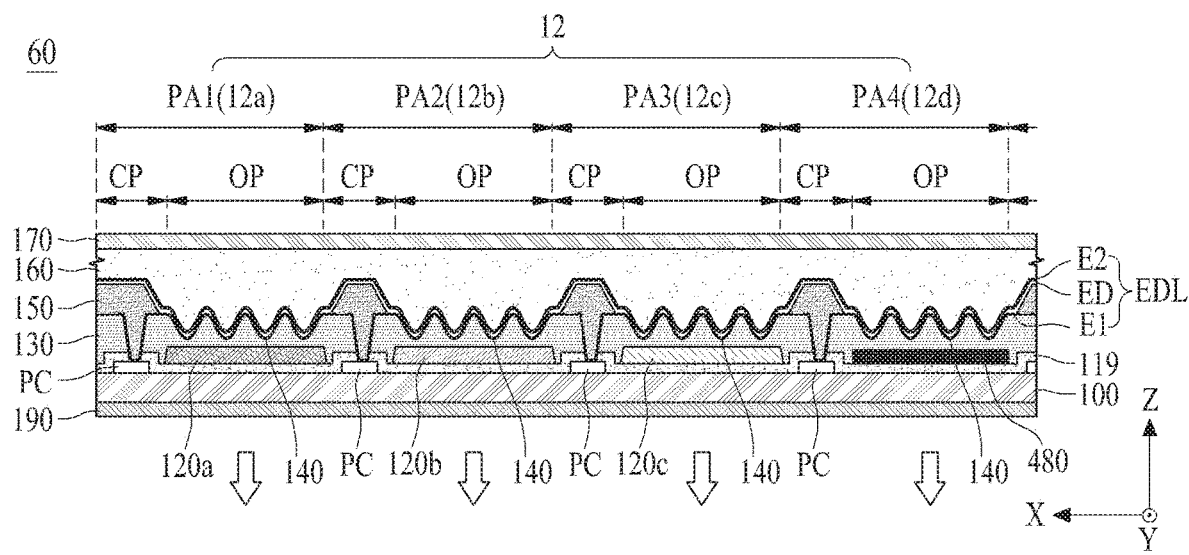

FIG. 11 is a view illustrating a display panel 60 according to further still another embodiment of the present disclosure. In FIG. 11, the selective wavelength absorbing member in the display panel shown in FIG. 8 is arranged inside the white pixel. Therefore, the same reference numerals are given to the other elements except the selective wavelength absorbing member and its related elements, and repeated description according to the same elements will be omitted.

Referring to FIG. 11, in the display panel 60 according to further still another embodiment of the present disclosure, the selective wavelength absorbing member 480 may be arranged to overlap the opening portion OP of the fourth pixel area PA4 (or the fourth pixel 12d) of the plurality of pixel areas PA1, PA2, PA3 and PA4 to reduce transmittance of the long wavelength of the spectrum of white light which is incident, whereby diffuse reflectance of the fourth pixel 12d (or white pixel) may be reduced.

The selective wavelength absorbing member 480 according to one embodiment may be arranged between the substrate 100 and the overcoat layer 130 to overlap only the opening portion OP of the fourth pixel area PA4 and may include a long wavelength absorption dye that absorbs a long wavelength of 640 nm to 680 nm. The selective wavelength absorbing member 480 may be surrounded by the overcoat layer 130. For example, the selective wavelength absorbing member 480 may be arranged between the protective layer 119 overlapped with the opening portion OP of the fourth pixel area PA4 and the overcoat layer 130.

In the display panel 60 according to further still another embodiment of the present disclosure, the polarizing film 190 may be attached to the rear surface of the substrate 100 as the selective wavelength absorbing member 480 is arranged between the substrate 100 overlapped with the opening portion OP of the fourth pixel PA4 and the overcoat layer 130.

Since the light emitting display apparatus according to further still another embodiment of the present disclosure, which comprises the display panel 60, comprises the selective wavelength absorbing member 480 arranged in the white pixel 12d, it may have the same effects as those of the light emitting display panel shown in FIG. 8.

Figure 12:
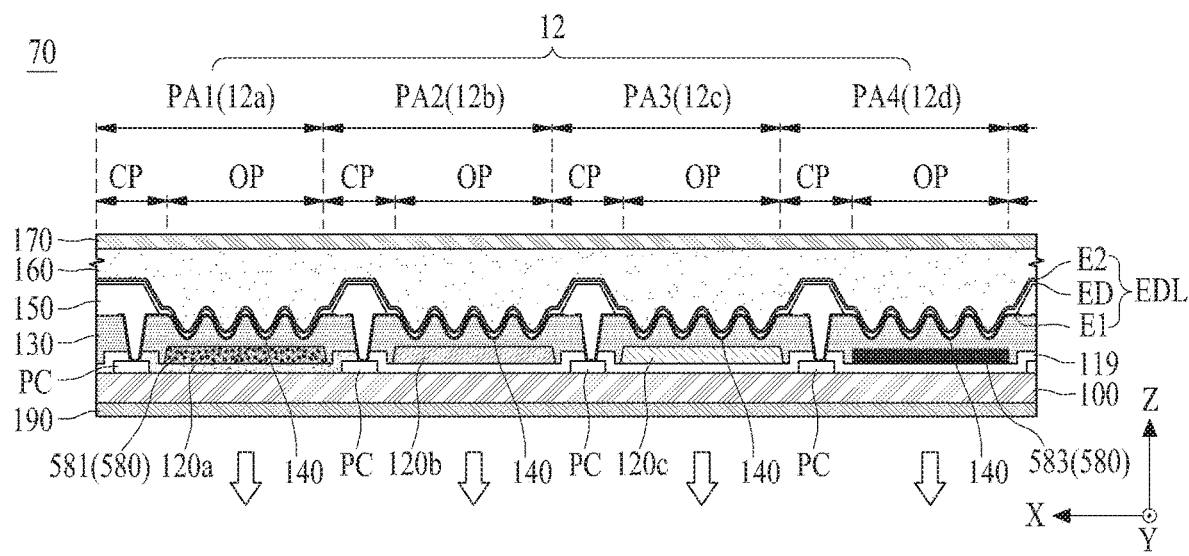

FIG. 12 is a view illustrating a display panel 70 according to further still another embodiment of the present disclosure. In FIG. 12, the selective wavelength absorbing member in the display panel shown in FIG. 8 is arranged inside the red pixel and the white pixel. Therefore, the same reference numerals are given to the other elements except the selective wavelength absorbing member and its related elements, and repeated description according to the same elements will be omitted.

Referring to FIG. 12, in the display panel 70 according to further still another embodiment of the present disclosure, the selective wavelength absorbing member 580 include a first selective wavelength absorbing member 581 contained in the wavelength conversion layer 120a arranged in the first pixel area PA1 and a second selective wavelength absorbing member 583 arranged to overlap the opening portion OP of the fourth pixel area PA4.

The first selective wavelength absorbing member 581 may include a long wavelength absorption dye contained in the wavelength conversion layer 120a arranged in the first pixel area PA1 to absorb light of a long wavelength of the spectrum of the red light. The first selective wavelength absorbing member 581 may reduce diffuse reflectance of the first pixel 12a (or red pixel) by reducing transmittance of the long wavelength of the spectrum of the red light emitted from the first pixel 12a to the outside.

The second selective wavelength absorbing member 583 may be arranged between the substrate 100 and the overcoat layer 130 to overlap only the opening portion OP of the fourth pixel area PA4 and may include a long wavelength absorption dye that absorbs a long wavelength of the spectrum of the white light. The second selective wavelength absorbing member 583 may reduce diffuse reflectance of the fourth pixel 12d (or white pixel) by reducing transmittance of the long wavelength of the spectrum of the white light emitted from the fourth pixel 12d to the outside.

Each of the first and second selective wavelength absorbing members 581 and 583 may include a long wavelength absorption dye that absorbs light of a long wavelength of 640 nm to 680 nm. For example, the long wavelength absorption dye may include at least one absorbing material of the chemical formula 1 and the chemical formula 2.

Optionally, in the display panel 60 according to further still another embodiment of the present disclosure, as shown in FIG. 10, the first selective wavelength absorbing member 581 may be arranged between the wavelength conversion layer 120a arranged in the first pixel area PA1 (or the first pixel 12a) and the overcoat layer 130 to reduce diffuse reflectance for light of a long wavelength, which is incident. The first selective wavelength absorbing member 581 is formed to surround the wavelength conversion layer 120a arranged in the red pixel 12a. Since this selective wavelength absorbing member 581 is substantially the same as the selective wavelength absorbing member 280 shown in FIG. 10, its repeated description will be omitted.

In the display panel 70 according to further still another embodiment of the present disclosure, the polarizing film 190 may be attached to the rear surface of the substrate 100 as the selective wavelength absorbing member 580 is arranged inside the red pixel 12a and the white pixel 12d.

Since the light emitting display apparatus according to further still another embodiment of the present disclosure, which comprises the display panel 70, comprises the selective wavelength absorbing member 580 arranged inside the red pixel 12a and the white pixel 12d, it may have the same effects as those of the light emitting display panel shown in FIG. 8.

Figure 13:
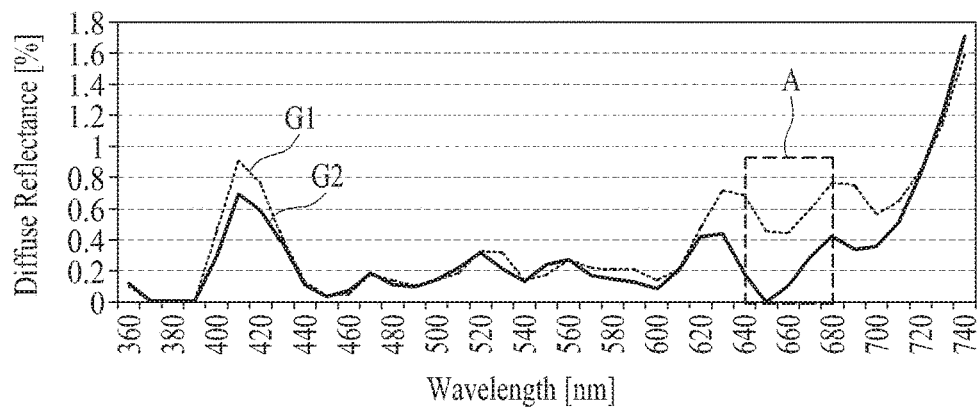
FIG. 13 is a graph illustrating diffuse reflectance of a display panel according to a first experimental example of the present disclosure and diffuse reflectance of a display panel according to a comparison example.

FIG. 13 is a graph illustrating diffuse reflectance of a display panel according to a first experimental example of the present disclosure and diffuse reflectance of a display panel according to a comparison example. In FIG. 13, a first graph G1 denotes diffuse reflectance for a wavelength of a display panel according to the comparison example that includes a polarizing film without including a selective wavelength absorbing member, and a second graph G2 denotes diffuse reflectance for a wavelength of a display panel according to the first experimental example of the present disclosure, which includes a selective wavelength absorbing member having a long wavelength absorption dye that absorbs a wavelength of maximum 647 nm.

Referring to FIG. 13, it is noted that the display panel according to the first experimental example of the present disclosure has diffuse reflectance in the whole wavelength, which is lower than that of the display panel according to the comparison example. Particularly, it is noted that diffuse reflectance is relatively reduced in a long wavelength A of 640 nm to 680 nm. Therefore, in the first experimental example of the present disclosure, diffuse reflectance of the long wavelength A which most contributes to diffuse reflectance of the display panel may be reduced through the selective wavelength absorbing member having a long wavelength absorption dye that absorbs a wavelength of 647 nm.

Figure 14:
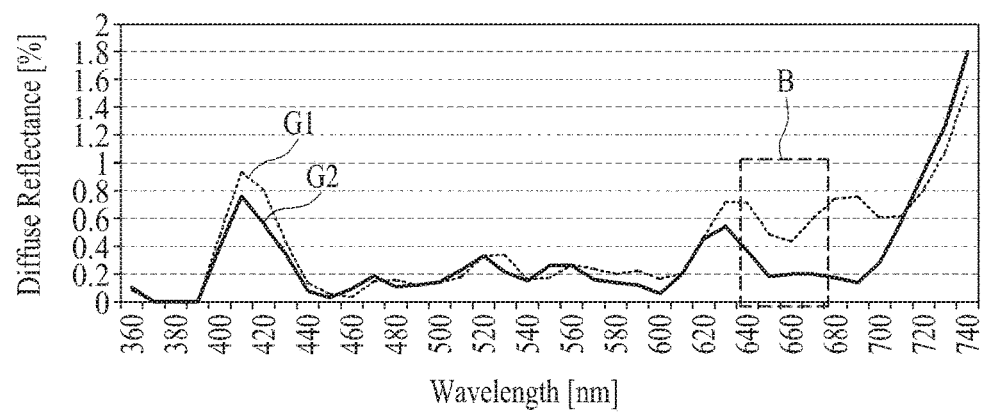
FIG. 14 is a graph illustrating diffuse reflectance of a display panel according to a second experimental example of the present disclosure and diffuse reflectance of a display panel according to a comparison example.

FIG. 14 is a graph illustrating diffuse reflectance of a display panel according to a second experimental example of the present disclosure and diffuse reflectance of a display panel according to a comparison example. In FIG. 14, a first graph G1 denotes diffuse reflectance for a wavelength of a display panel according to the comparison example that includes a polarizing film without including a selective wavelength absorbing member, and a second graph G2 denotes diffuse reflectance for a wavelength of a display panel according to the second experimental example of the present disclosure, which includes a selective wavelength absorbing member having a long wavelength absorption dye that absorbs a wavelength of maximum 678 nm.

Referring to FIG. 14, it is noted that the display panel according to the second experimental example of the present disclosure has diffuse reflectance in a wavelength of 710 nm, which is lower than that of the display panel according to the comparison example. Particularly, it is noted that diffuse reflectance is relatively reduced in a long wavelength B of 640 nm to 680 nm. Therefore, in the second experimental example of the present disclosure, diffuse reflectance of the long wavelength B which most contributes to diffuse reflectance of the display panel may be reduced through the selective wavelength absorbing member having a long wavelength absorption dye that absorbs a wavelength of 678 nm.

Figure 15:
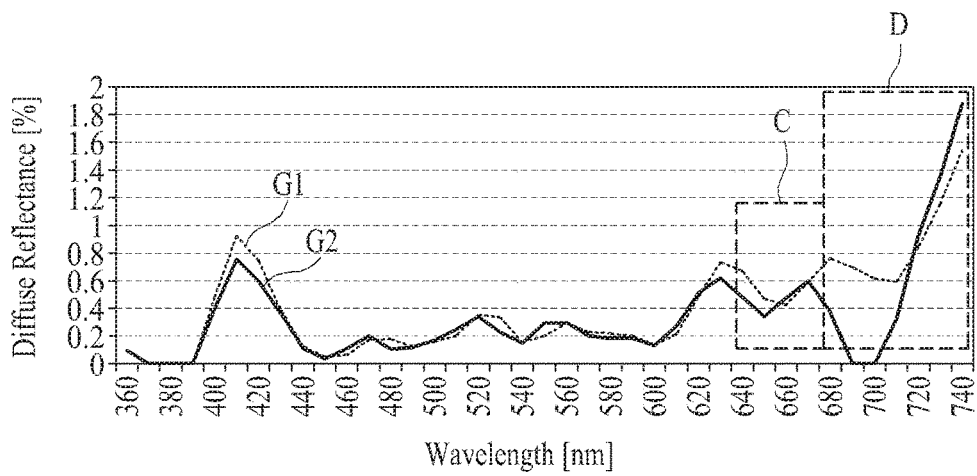
FIG. 15 is a graph illustrating diffuse reflectance of a display panel according to a third experimental example of the present disclosure and diffuse reflectance of a display panel according to a comparison example.

FIG. 15 is a graph illustrating diffuse reflectance of a display panel according to a third experimental example of the present disclosure and diffuse reflectance of a display panel according to a comparison example. In FIG. 15, a first graph G1 denotes diffuse reflectance for a wavelength of a display panel according to the comparison example that includes a polarizing film without including a selective wavelength absorbing member, and a second graph G2 denotes diffuse reflectance for a wavelength of a display panel according to the third experimental example of the present disclosure, which includes a selective wavelength absorbing member having a long wavelength absorption dye that absorbs a wavelength of maximum 694 nm.

Referring to FIG. 15, it is noted that the display panel according to the third experimental example of the present disclosure has diffuse reflectance in the whole wavelength, which is lower than that of the display panel according to the comparison example. Particularly, it is noted that diffuse reflectance is relatively reduced in a long wavelength D of 680 nm to 710 nm rather than a long wavelength C of 640 nm to 680 nm. However, since the long wavelength of 700 nm or more does not contribute largely to reduction of the diffuse reflectance, it is noted that the selective wavelength absorbing member having a long wavelength absorption dye that absorbs a wavelength of maximum 694 nm is not effective to reduce diffuse reflectance of the display panel.

Therefore, as will be aware of it from FIGS. 13 to 15, the present disclosure may be reduce the diffuse reflectance of the long wavelength which most largely contributes to diffuse reflectance of the display panel by using the selective wavelength absorbing member having a long wavelength absorption dye that absorbs a wavelength of 640 nm to 680 nm.

Results of a color temperature, red luminance, white luminance, diffuse reflectance, total reflectance, and total reflectance in 550 nm, which are respectively measured in the display panel according to the reference example, the display panel according to the comparison example, and the display panels according to the first to third experimental examples of the present disclosure, may be as listed in the following Table 1.

TABLE 1

|  | Reference example | Comparison example | First experimental example | Second experimental example | Third experimental example |
| --- | --- | --- | --- | --- | --- |
| Diffuse reflectance (L*SCE) | 0.66 | 2.89 | 2.41 | 2.57 | 2.8 |
| Total reflectance (SCI) | 1.33 | 1.72 | 1.46 | 1.47 | 1.49 |
| Total reflectance (550 nm) (SCI) | 1.16 | 1.58 | 1.47 | 1.49 | 1.47 |

TABLE 1-continued

|  | Reference example | Comparison example | First experimental example | Second experimental example | Third experimental example |
|---|---|---|---|---|---|
| Color temperature | 7,402 K | 6,211 K | 7,142 K | 6,922 K | 6,480 K |
| Red luminance (Normal/Peak) | 161/520 | 242/818 | 184/609 | 204/675 | 233/773 |
| White luminance (Normal/Peak) | 151/500 | 149/502 | 180/593 | 173/572 | 162/540 |

In Table 1, a normal display panel that does not include a light emission pattern, a selective wavelength absorbing member and a polarizing film according to the present disclosure has been used as the display panel according to the reference example, and a display panel that includes a light emission pattern and a polarizing film without including a selective wavelength absorbing member has been used as the display panel according to the comparison example. A Specular Component Excluded (SCE) system that measures only diffuse reflective light from which forward reflective light is removed has been used to measure diffuse reflectance (L*SCE), a Specular Component Included (SCI) system that measures forward reflective light as well as diffuse reflective light has been used to measure total reflectance (SCI). For example, in the SCE system and the SCI system, the unit of measurement of the reflected light may be the lumens (lx), but is not limited thereto.

In each of diffuse reflectance, total reflectance and total reflectance in 550 nm of Table 1, it is noted that each of the first to third experimental examples of the present disclosure has diffuse reflectance, total reflectance and total reflectance in 550 nm, which are higher than those of the reference example and lower than those of the comparison example. That is, since the reference example does not include a light emission pattern, scattered light due to the light emission pattern is relatively less than the other examples, whereby the reference example may have low diffuse reflectance and low total reflectance and low total reflectance in 550 nm. The comparison example may have relatively high diffuse reflectance and relatively high total reflectance and relatively high total reflectance in 550 nm due to the scattered light of the light emission pattern. On the other hand, the first to third experimental examples of the present disclosure have diffuse reflectance and total reflectance and total reflectance in 550 nm, which are lower than the comparison example, as transmittance of the long wavelength of the spectrum of the scattered light due to the light emission pattern is reduced by the selective wavelength absorbing member. For example, it is noted that diffuse reflectance of the display panel according to the first to third experimental examples of the present disclosure is reduced as much as about 17%, about 11% and about 3% compared with the comparison example. Also, it is noted that total reflectance of the display panel according to the first to third experimental examples of the present disclosure is reduced as much as 15%, about 15% and about 13% compared with the comparison example. Further, it is noted that total reflectance in 550 nm of the display panel according to the first to third experimental examples of the present disclosure is reduced as much as about 7%, about 6% and about 7% compared with the comparison example. As a result, it is noted that a reduction amount of each of diffuse reflectance, total reflectance and total reflectance in 550 nm is increased if a maximum absorption wavelength of the long wavelength absorption dye is close to a red peak wavelength.

In the color temperature of Table 1, it is noted that each of the first to third experimental examples of the present disclosure has a color temperature lower than that of the reference example but has a color temperature higher than that of the comparison example. In this case, as transmittance of the long wavelength of the spectrum of the scattered light due to the light emission pattern is reduced by the selective wavelength absorbing member, each of the first to third experimental examples of the present disclosure has reduced diffuse reflectance compared with the comparison example, whereby each of the first to third experimental examples of the present disclosure may have a color temperature higher than that of the comparison example. For example, it is noted that the color temperature of each of the first to third experimental examples of the present disclosure is higher than that of the comparison example by as much as about 15%, about 11% and about 4%. As a result, it is noted that an increase amount of the color temperature is increased if a maximum absorption wavelength of the long wavelength absorption dye is close to a red peak wavelength.

In red luminance of Table 1, it is noted that each of the first to third experimental examples of the present disclosure has red normal luminance and red peak luminance, which are higher than those of the reference example but lower than those of the comparison example. In this case, as transmittance of the long wavelength of the spectrum of the red light is reduced by the selective wavelength absorbing member, it is noted that each of the first to third experimental examples of the present disclosure has red normal luminance and red peak luminance, which are lower than those of the comparison example. For example, it is noted that red normal luminance and red peak luminance according to the first experimental example of the present disclosure are respectively reduced as much as about 24% and about 26% compared with the comparison example, red normal luminance and red peak luminance according to the second experimental example of the present disclosure are respectively reduced as much as about 16% and about 17% compared with the comparison example, and red normal luminance and red peak luminance according to the third experimental example of the present disclosure are respectively reduced as much as about 4% and about 6% compared with the comparison example. As a result, it is noted that a reduction amount of red luminance is relatively increased if a maximum absorption wavelength of the long wavelength absorption dye is close to a red peak wavelength, whereby a reduction amount of transmittance of the long wavelength of 640 nm to 680 nm in the spectrum of the red light is increased.

In white luminance of Table 1, it is noted that each of the first to third experimental examples of the present disclosure has white normal luminance and white peak luminance, which are higher than those of the reference example and the comparison example. In this case, it is noted that each of the first to third experimental examples of the present disclosure has white normal luminance and white peak luminance, which are higher than those of the reference example and the comparison example due to increase of the color temperature according to reduction of transmittance of the long wavelength of 640 nm to 680 nm in the spectrum of white light. For example, it is noted that white normal luminance and white peak luminance according to the first experimental example of the present disclosure are respectively increased as much as about 21% and about 18% compared with the comparison example, white normal luminance and white peak luminance according to the second experimental example of the present disclosure are respectively increased as much as about 16% and about 14% compared with the comparison example, and white normal luminance and white peak luminance according to the third experimental example of the present disclosure are respectively increased as much as about 9% and about 8% compared with the comparison example. As a result, it is noted that an increase amount of white luminance is increased if a maximum absorption wavelength of the long wavelength absorption dye is close to a red peak wavelength.

Figure 16:
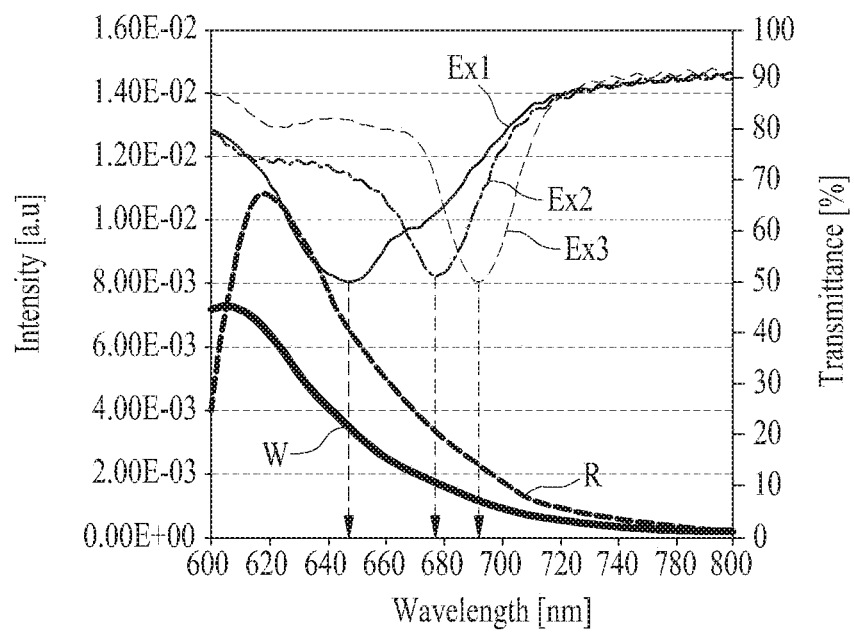
FIG. 16 is a graph illustrating a wavelength intensity and light transmittance of a display panel according to first to third experimental examples of the present disclosure.

FIG. 16 is a graph illustrating a wavelength intensity and light transmittance of a display panel according to first to third experimental examples of the present disclosure. In FIG. 16, W denotes white wavelength intensity and light transmittance, R denotes red wavelength intensity and light transmittance, Ex1 denotes the display panel according to the first experimental example, Ex2 denotes the display panel according to the second experimental example, and Ex3 denotes the display panel according to the third experimental example. In FIG. 16, the abscissa axis represents a wavelength (nm), and the ordinate axis represents an intensity (arbitrary unit [a.u.]).

As will be aware of it from FIG. 16, since the display panel Ex1 according to the first experimental example of the present disclosure includes a selective wavelength absorbing member that includes a long wavelength absorption dye having a maximum absorption wavelength of 647 nm, it is noted that light transmittance and intensity in a red peak wavelength of a wavelength of 600 nm to 800 nm, for example, a long wavelength of 620 nm to 700 nm close to 620 nm are relatively reduced.

Also, since the display panel Ex2 according to the second experimental example of the present disclosure includes a selective wavelength absorbing member that includes a long wavelength absorption dye having a maximum absorption wavelength of 678 nm, it is noted that light transmittance and intensity in a red peak wavelength of a wavelength of 600 nm to 800 nm, for example, a long wavelength of 620 nm to 700 nm close to 620 nm are relatively reduced.

Also, since the display panel Ex3 according to the third experimental example of the present disclosure includes a selective wavelength absorbing member that includes a long wavelength absorption dye having a maximum absorption wavelength of 694 nm, it is noted that light transmittance and intensity in a red peak wavelength of a wavelength of 600 nm to 800 nm, for example, a long wavelength of 680 nm to 710 nm rather than a long wavelength of 640 nm to 680 nm close to 620 nm are relatively reduced.

As a result, in the present disclosure, intensity and light transmittance of the long wavelength close to the red peak wavelength may be reduced through the selective wavelength absorbing member that includes a long wavelength absorption dye capable of absorbing a long wavelength of 640 nm to 680 nm, whereby diffuse reflectance of the long wavelength which most contributes to diffuse reflectance of the display panels Ex1 and Ex2 may be reduced, and visual characteristic of a black image according to diffuse reflectance may be improved.

The light emitting display apparatus according to the present disclosure may be described as follows.

The light emitting display apparatus according to the present disclosure comprises a substrate including a plurality of pixel areas, a light emission pattern arranged in each of the plurality of pixel areas, a light emitting device layer arranged over the light emission pattern, and a selective wavelength absorbing member overlapped with at least one of the plurality of pixel areas, wherein the selective wavelength absorbing member may reduce diffuse reflectance for light of a long wavelength, which is incident.

According to one example of the present disclosure, the long wavelength may range from 640 nm to 680 nm.

According to one embodiment of the present disclosure, the selective wavelength absorbing member may include a long wavelength absorption dye absorbing light of the long wavelength.

According to one embodiment of the present disclosure, the long wavelength absorption dye may have a maximum absorption wavelength of 647 nm or 678 nm.

The light emitting display apparatus according to one embodiment of the present disclosure may further comprise an overcoat layer arranged over the substrate and including the light emission pattern, and a wavelength conversion layer arranged in an opening portion of each of the plurality of pixel areas, wherein the wavelength conversion layer may be arranged between the substrate and the overcoat layer.

According to one embodiment of the present disclosure, the selective wavelength absorbing member may be overlapped with a red pixel area of the plurality of pixel areas.

According to one embodiment of the present disclosure, the selective wavelength absorbing member may include a long wavelength absorption dye absorbing light of the long wavelength of the plurality of pixel areas, and the long wavelength absorption dye may be mixed with the wavelength conversion layer arranged in the red pixel area.

According to one embodiment of the present disclosure, the selective wavelength absorbing member may be arranged between the wavelength conversion layer arranged in the red pixel area of the plurality of pixel areas and the overcoat layer, and may include a long wavelength absorption dye absorbing light of the long wavelength. According to one embodiment of the present disclosure, the selective wavelength absorbing member may be overlapped with a white pixel area of the plurality of pixel areas.

The light emitting display apparatus according to one embodiment of the present disclosure may further comprise an overcoat layer arranged over the substrate, including the light emission pattern, wherein the selective wavelength absorbing member may be arranged between the substrate and the overcoat layer to overlap a white pixel area of the plurality of pixel areas, and may include the long wavelength absorption dye.

According to one embodiment of the present disclosure, the selective wavelength absorbing member may be overlapped with a red pixel area and a white pixel area of the plurality of pixel areas.

The light emitting display apparatus according to one embodiment of the present disclosure may further comprise an overcoat layer arranged over the substrate, including the light emission pattern, and a wavelength conversion layer arranged in an opening portion of each of the other pixels areas except a white pixel area of the plurality of pixel areas, wherein the selective wavelength absorbing member may include a first selective wavelength absorbing member mixed with the wavelength conversion layer arranged in the red pixel area of the plurality of pixel areas, and a second selective wavelength absorbing member arranged between the substrate overlapped with the white pixel area and the overcoat layer, and each of the first and second selective wavelength absorbing members may include a long wavelength absorption dye absorbing light of the long wavelength.

The light emitting display apparatus according to one embodiment of the present disclosure may further comprise an overcoat layer arranged over the substrate, including the light emission pattern, and a wavelength conversion layer arranged in an opening portion of each of the other pixels areas except a white pixel area of the plurality of pixel areas, wherein the selective wavelength absorbing member may include a first selective wavelength absorbing member arranged between the wavelength conversion layer arranged in the red pixel area of the plurality of pixel areas and the overcoat layer, and a second selective wavelength absorbing member arranged between the substrate overlapped with the white pixel area and the overcoat layer, and each of the first and second selective wavelength absorbing members may include a long wavelength absorption dye absorbing light of the long wavelength.

According to one embodiment of the present disclosure, the selective wavelength absorbing member may include a selective wavelength absorbing film including a long wavelength absorption dye absorbing light of the long wavelength, and the selective wavelength absorbing film may be attached to a second surface opposite to a first surface of the substrate, on which the plurality of pixels areas are arranged.

The light emitting display apparatus according to one embodiment of the present disclosure may further comprise a polarizing film attached to the selective wavelength absorbing film or interposed between the second surface of the substrate and the selective wavelength absorbing film.

According to one embodiment of the present disclosure, the substrate may include a first surface on which a plurality of pixel areas are arranged, and a second surface opposite to the first surface, and the selective wavelength absorbing member may include a selective wavelength absorbing coating layer arranged over the second surface of the substrate in an island shape to overlap each of the red pixel area and the white pixel area, and the selective wavelength absorbing coating layer may include a long wavelength absorption dye absorbing light of the long wavelength.

The light emitting display apparatus according to one embodiment of the present disclosure may further comprise a polarizing film overlaying the selective wavelength absorbing member.

According to one embodiment of the present disclosure, the light emission pattern may include a plurality of convex portions.

According to one embodiment of the present disclosure, the selective wavelength absorbing member may include a selective wavelength absorbing film that includes a long wavelength absorption dye absorbing light of the long wavelength, and the selective wavelength absorbing film may be attached to the second surface opposite to the first surface of the substrate, on which the plurality of pixel areas are arranged.

The light emitting display apparatus according to one embodiment of the present disclosure may further comprise a polarizing film attached to the second surface opposite to the first surface of the substrate, on which the plurality of pixel areas are arranged, and the selective wavelength absorbing member may have a film shape that includes a long wavelength absorption dye absorbing light of the long wavelength and may be attached to the polarizing film.

According to one embodiment of the present disclosure, the substrate may include a first surface on which a plurality of pixel areas are arranged, and a second surface opposite to the first surface, and the selective wavelength absorbing member may include a selective wavelength absorbing coating layer coated over the second surface of the substrate, and the selective wavelength absorbing coating layer may include a long wavelength absorption dye absorbing light of the long wavelength.

The light emitting display apparatus according to one embodiment of the present disclosure may comprise a substrate including a plurality of pixel areas defined over a first surface, a light emission pattern arranged in each of the plurality of pixel areas, a light emitting device layer arranged over the light emission pattern, and a selective wavelength absorbing member arranged over a second surface opposite to the first surface of the substrate, wherein the selective wavelength absorbing member may reduce transmittance of light of a long wavelength, which is incident.

The light emitting display apparatus according to one embodiment of the present disclosure may comprise a substrate including a pixel area, a micro lens positioned in the pixel area, a light emitting device layer positioned over the micro lens, a selective wavelength absorbing member positioned to overlay the pixel area. The selective wavelength absorbing member reduces transmittance of light of a long wavelength, which is incident on the selective wavelength absorbing member. In preferred embodiment, the selective wavelength absorbing member absorbs light in the range of 640 to 680 nm to reduce the output of red light in the pixel area. The long wavelength is one of either 647 nm or 678 nm. The pixel area includes a red subpixel, or a red subpixel and a white subpixel. The selective wavelength absorbing member positioned to overlay the red subpixel, or the red subpixel and the white subpixel.

The light emitting display apparatus according to one embodiment of the present disclosure may further comprise a color filter of a selective range of wavelengths positioned in the pixel area. The selective wavelength absorbing member is within the color filter or is positioned over the color filter.

According to one embodiment of the present disclosure, the selective wavelength absorbing member includes a selective wavelength absorbing film including a long wavelength absorption dye absorbing light of the long wavelength. The selective wavelength absorbing member is attached to a second surface opposite to a first surface of the substrate, on which the pixel area is arranged.

The light emitting display apparatus according to one embodiment of the present disclosure may comprise a substrate that includes a pixel area having a plurality of subpixels, a light emitting device layer positioned in each of the sub-pixels, one of the subpixels being a red subpixel that emits red light of a wavelength within the range of 625 to 740, a selective wavelength absorbing member positioned to overlay the subpixel emitting red light, wherein the selective wavelength absorbing member absorbs light in the range of 640 to 690 nm to reduce the output of red light from the pixel area. In preferred embodiment, the light emitting display apparatus absorbs light having a wavelength is one of either 678 nm or 647. In other embodiments, the wavelength of absorbed light is exclusively within the range of 640 to 690 nm and light outside of this range is not absorbed.

In preferred embodiment, the light emitting display apparatus according to one embodiment of the present disclosure may further comprise a blue subpixel and a green subpixel within the pixel. In other embodiments, the selective wavelength absorbing member positioned to overlay the entire pixel, including all subpixels within the pixel. In other embodiments, the selective wavelength absorbing member positioned to overlay only the red subpixel within the pixel.

The light emitting display apparatus according to one embodiment of the present disclosure may further comprise a polarizing film attached to the selective wavelength absorbing member or interposed between the second surface of the substrate and the selective wavelength absorbing member.

According to one embodiment of the present disclosure, the selective wavelength absorbing member may include a selective wavelength absorbing coating layer coated over the second surface of the substrate, and the selective wavelength absorbing coating layer may include a long wavelength absorption dye absorbing light of the long wavelength.

The light emitting display apparatus according to one embodiment of the present disclosure may further comprise a bank pattern disposed on the overcoat layer and defining the opening portion of each of the plurality of pixel areas, an edge of the wavelength conversion layer may be extended beyond an edge of the light emission pattern toward below the bank pattern.

According to one embodiment of the present disclosure, the light emission pattern may include a plurality of concave portions, the plurality of concave portions may be arranged in parallel with each other along a first direction and in a zigzag arrangement along a second direction intersecting the first direction.

According to one embodiment of the present disclosure, the light emission pattern may include a plurality of concave portions and a plurality of convex portions surrounding each of the plurality of concave portions, the plurality of convex portions may have a hexagonal shape, resulting in the structure having a honeycomb structure in plan view.

The light emitting display apparatus according to one embodiment of the present disclosure may comprise a substrate including a pixel area having a plurality of sub-pixels including a red subpixel, a blue subpixel and a green subpixel, a light emitting device layer positioned in each of the sub-pixels, and a selective wavelength absorbing member overlying at least a portion of the pixel area, wherein the selective wavelength absorbing member reduces the output of light of a long wavelength within a range that is in excess of 640 nm and less than 680 nm. In preferred embodiment, the selective wavelength absorbing member overlays only the red subpixel area or all subpixels within the pixel area. The pixel area further includes a white subpixel, and wherein selective wavelength absorbing member overlays at least one of the red subpixel and the white subpixel. The light emitting display apparatus may further comprise a light emission pattern positioned within the pixel area through which light emission patter outputs diffuse reflective light.

It will be apparent to those skilled in the art that the present disclosure described above is not limited by the above-described embodiments and the accompanying drawings and that various substitutions, modifications, and variations can be made in the present disclosure without departing from the spirit or scope of the disclosures. Consequently, the scope of the present disclosure is defined by the accompanying claims, and it is intended that all variations or modifications derived from the meaning, scope, and equivalent concept of the claims fall within the scope of the present disclosure.

The various embodiments described above can be combined to provide further embodiments. All of the U.S. patents, U.S. patent application publications, U.S. patent applications, foreign patents, foreign patent applications and non-patent publications referred to in this specification and/or listed in the Application Data Sheet are incorporated herein by reference, in their entirety. Aspects of the embodiments can be modified, if necessary to employ concepts of the various patents, applications and publications to provide yet further embodiments.

These and other changes can be made to the embodiments in light of the above-detailed description. In general, in the following claims, the terms used should not be construed to limit the claims to the specific embodiments disclosed in the specification and the claims, but should be construed to include all possible embodiments along with the full scope of equivalents to which such claims are entitled. Accordingly, the claims are not limited by the disclosure.

What is claimed is:

1. A light emitting display apparatus, comprising:
a substrate including a pixel area;
a light emitting device layer positioned in the pixel area;
at least one color filter of a selective range of wavelengths positioned in the pixel area;
an overcoat layer positioned over the at least one color filter;
a wavelength conversion layer positioned in an opening portion of the pixel area between the substrate and the overcoat layer, the wavelength conversion layer including the at least one color filter; and
a selective wavelength absorbing member positioned aligned with the at least one color filter, the selective wavelength absorbing member overlying the pixel area,
wherein the selective wavelength absorbing member reduces light of a long wavelength that is output by the light emitting display apparatus,
wherein the pixel area includes a red pixel area that emits red light,
wherein the selective wavelength absorbing member includes a long wavelength absorption dye for absorbing light of the long wavelength, and
wherein the selective wavelength absorbing member is positioned between the wavelength conversion layer positioned in the red pixel area and the overcoat layer.

2. The light emitting display apparatus of claim 1 further including a light emission pattern positioned in the pixel area.

3. The light emitting display apparatus of claim 2,
wherein the light emission pattern is a part of the overcoat layer.

4. The light emitting display apparatus of claim 3,
wherein the long wavelength absorption dye is mixed with the wavelength conversion layer positioned in the red pixel area.

5. The light emitting display apparatus of claim 2, further comprising
a white pixel area that emits white light and positioned in the pixel area,
wherein the wavelength conversion layer is positioned in the opening portion of each of the other pixels areas except the white pixel area,
wherein the overcoat layer includes the light emission pattern, and wherein the selective wavelength absorbing member includes:
a first selective wavelength absorbing member positioned between the wavelength conversion layer positioned in the red pixel area and the overcoat layer;
a second selective wavelength absorbing member positioned between the substrate overlapped with the white pixel area and the overcoat layer.

6. The light emitting display apparatus of claim 1 wherein the selective wavelength absorbing member is within the at least one color filter.

7. The light emitting display apparatus of claim 1 wherein the selective wavelength absorbing member is positioned below the at least one color filter.

8. The light emitting display apparatus of claim 1, wherein the selective wavelength absorbing member includes a selective wavelength absorbing film including the long wavelength absorption dye absorbing light of the long wavelength, and
wherein the selective wavelength absorbing member is attached to a second surface of the substrate.

9. A light emitting display apparatus, comprising:
a substrate including a pixel area;
a micro lens positioned in the pixel area;
a light emitting device layer positioned over the micro lens;
at least one color filter of a selective range of wavelengths positioned in the pixel area;
an overcoat layer positioned over the at least one color filter, the micro lens being a part of the overcoat layer;
a wavelength conversion layer positioned in an opening portion of the pixel area between the substrate and the overcoat layer, the wavelength conversion layer including the at least one color filter; and
a selective wavelength absorbing member positioned to overlay the pixel area,
wherein the selective wavelength absorbing member reduces transmittance of light of a long wavelength, which is incident on the selective wavelength absorbing member,
wherein the pixel area includes a red pixel area that emits red light,
wherein the selective wavelength absorbing member includes a long wavelength absorption dye absorbing light of the long wavelength, and
wherein the selective wavelength absorbing member is positioned between the wavelength conversion layer positioned in the red pixel and the overcoat layer.

10. The light emitting display apparatus of claim 9, wherein the selective wavelength absorbing member absorbs light in the range of 640 to 680 nm to reduce the output of red light in the pixel area.

11. The light emitting display apparatus of claim 10, wherein the long wavelength is one of either 647 nm or 678 nm.

12. The light emitting display apparatus of claim 9, wherein the pixel area includes a red subpixel, or a red subpixel and a white subpixel, and
wherein the selective wavelength absorbing member positioned to overlay the red subpixel, or the red subpixel and the white subpixel.

13. The light emitting display apparatus of claim 9, wherein the selective wavelength absorbing member is within the at least one color filter or is positioned over the at least one color filter.

14. The light emitting display apparatus of claim 9, wherein the selective wavelength absorbing member includes a selective wavelength absorbing film including the long wavelength absorption dye absorbing light of the long wavelength, and
wherein the selective wavelength absorbing member is attached to a second surface opposite to a first surface of the substrate, on which the pixel area is arranged.

15. A light emitting display apparatus, comprising:
a substrate including a pixel area having a plurality of subpixels including a red subpixel, a blue subpixel and a green subpixel;
a light emitting device layer positioned in each of the sub-pixels;
at least one color filter of a selective range of wavelengths positioned in the pixel area;
an overcoat layer positioned over the at least one color filter;
a wavelength conversion layer positioned in an opening portion of the pixel area between the substrate and the overcoat layer, the wavelength conversion layer including the at least one color filter; and
a selective wavelength absorbing member overlying at least a portion of the pixel area,
wherein the selective wavelength absorbing member reduces the output of light of a long wavelength within a range that is in excess of 640 nm and less than 680 nm,
wherein the selective wavelength absorbing member includes a long wavelength absorption dye absorbing light of the long wavelength, and
wherein the selective wavelength absorbing member is positioned between the wavelength conversion layer positioned in the red subpixel and the overcoat layer.

16. The light emitting display apparatus of claim 15, wherein the selective wavelength absorbing member overlays only the red subpixel area or all subpixels within the pixel area.

17. The light emitting display apparatus of claim 15, wherein the pixel area further includes a white subpixel, and
wherein the selective wavelength absorbing member overlays at least one of the red subpixel and the white subpixel.

18. The light emitting display apparatus of claim 15, further including a light emission pattern positioned within the pixel area through which light emission pattern outputs diffuse reflective light.

* * * * *